United States Patent
Bedeschi

(10) Patent No.: US 10,734,057 B2
(45) Date of Patent: Aug. 4, 2020

(54) MULTIPLE PLATE LINE ARCHITECTURE FOR MULTIDECK MEMORY ARRAY

(71) Applicant: Micron Technology, Inc., Boise, ID (US)

(72) Inventor: Ferdinando Bedeschi, Biassono (IT)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/387,208

(22) Filed: Apr. 17, 2019

(65) Prior Publication Data

US 2019/0244652 A1 Aug. 8, 2019

Related U.S. Application Data

(60) Continuation of application No. 16/041,455, filed on Jul. 20, 2018, now Pat. No. 10,304,513, which is a (Continued)

(51) Int. Cl.
*G11C 13/00* (2006.01)
*G11C 11/22* (2006.01)
(Continued)

(52) U.S. Cl.
CPC .......... *G11C 11/22* (2013.01); *G11C 11/221* (2013.01); *G11C 11/2257* (2013.01); *G11C 11/2259* (2013.01); *G11C 11/2273* (2013.01); *H01L 27/11502* (2013.01); *H01L 27/11514* (2013.01); *G11C 11/2275* (2013.01); *H01L 27/11507* (2013.01)

(58) Field of Classification Search
CPC .............. G11C 11/2257; G11C 11/221; G11C 11/2259; G11C 11/2273

USPC ........................................................ 365/130
See application file for complete search history.

(56) References Cited

U.S. PATENT DOCUMENTS 5,373,463 A 12/1994 Jones, Jr.
6,754,124 B2 6/2004 Seyyedy et al.
(Continued)

OTHER PUBLICATIONS

ISA/KR, International Search Report and Written Opinion of the International Searching Authority, In'l Appl. No. PCT/US2018/021807, dated Jun. 19, 2018, Korean Intellectual Property Office, Daejeon, Republic of Korea, 15 pgs.

*Primary Examiner* — Xiaochun L Chen
(74) *Attorney, Agent, or Firm* — Holland & Hart LLP

(57) ABSTRACT

Methods, systems, and devices for multiple plate line architecture for multideck memory arrays are described. A memory device may include two or more three-dimensional arrays of ferroelectric memory cells overlying a substrate layer that includes various components of support circuitry, such as decoders and sense amplifiers. Each memory cell of the array may have a ferroelectric container and a selector device. Multiple plate lines or other access lines may be routed through the various decks of the device to support access to memory cells within those decks. Plate lines or other access lines may be coupled between support circuitry and memory cells through on pitch via (OPV) structures. OPV structures may include selector devices to provide an additional degree of freedom in multideck selectivity. Various number of plate lines and access lines may be employed to accommodate different configurations and orientations of the ferroelectric containers.

18 Claims, 16 Drawing Sheets

Related U.S. Application Data division of application No. 15/469,865, filed on Mar. 27, 2017, now Pat. No. 10,262,715.

(51) Int. Cl.
*H01L 27/11502* (2017.01)
*H01L 27/11514* (2017.01)
*H01L 27/11507* (2017.01)

(56) References Cited

U.S. PATENT DOCUMENTS

| | | |
|---|---|---|
| 6,819,581 B2 | 11/2004 | Ito |
| 7,291,878 B2 | 11/2007 | Stipe |
| 7,405,962 B2 | 7/2008 | Kajiyama |
| 7,843,715 B2 | 11/2010 | Park et al. |
| 9,269,430 B1 | 6/2016 | Park et al. |
| 9,361,979 B2 | 6/2016 | Wells et al. |
| 2004/0047219 A1 | 3/2004 | Ito |
| 2012/0069681 A1* | 3/2012 | Oikawa ............... G11C 11/5628 365/185.24 |
| 2015/0162084 A1 | 6/2015 | Morooka et al. |

\* cited by examiner

Plate line decoder

Global plate line

Local plate line

OPV

US 10,734,057 B2

MULTIPLE PLATE LINE ARCHITECTURE FOR MULTIDECK MEMORY ARRAY

CROSS REFERENCE

The present Application for Patent is a continuation of U.S. patent application Ser. No. 16/041,455 by Bedeschi, entitled "Multiple Plate Line Architecture for Multideck Memory Array," filed Jul. 20, 2018, now issued as U.S. Pat. No. 10,304,513, which is a divisional of U.S. patent application Ser. No. 15/469,865 by Bedeschi, entitled "Multiple Plate Line Architecture for Multideck Memory Array," filed Mar. 27, 2017, now issued as U.S. Pat. No. 10,262,716, both of which are assigned to the assignee hereof, and each of which is expressly incorporated by reference in its entirety herein.

BACKGROUND

The following relates generally to memory array and more specifically to multiple plate line architecture for multideck memory array.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store SPECinformation, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

Improving memory devices, generally, may include increasing memory cell density, increasing read/write speeds, increasing reliability, increasing data retention, reducing power consumption, or reducing manufacturing costs, among other metrics. But physical limitations for plate line and other access line routing may negatively affect memory cell density.

BRIEF DESCRIPTION OF THE DRAWINGS

The disclosure herein refers to and includes the following figures.

DETAILED DESCRIPTION

Figure 1:
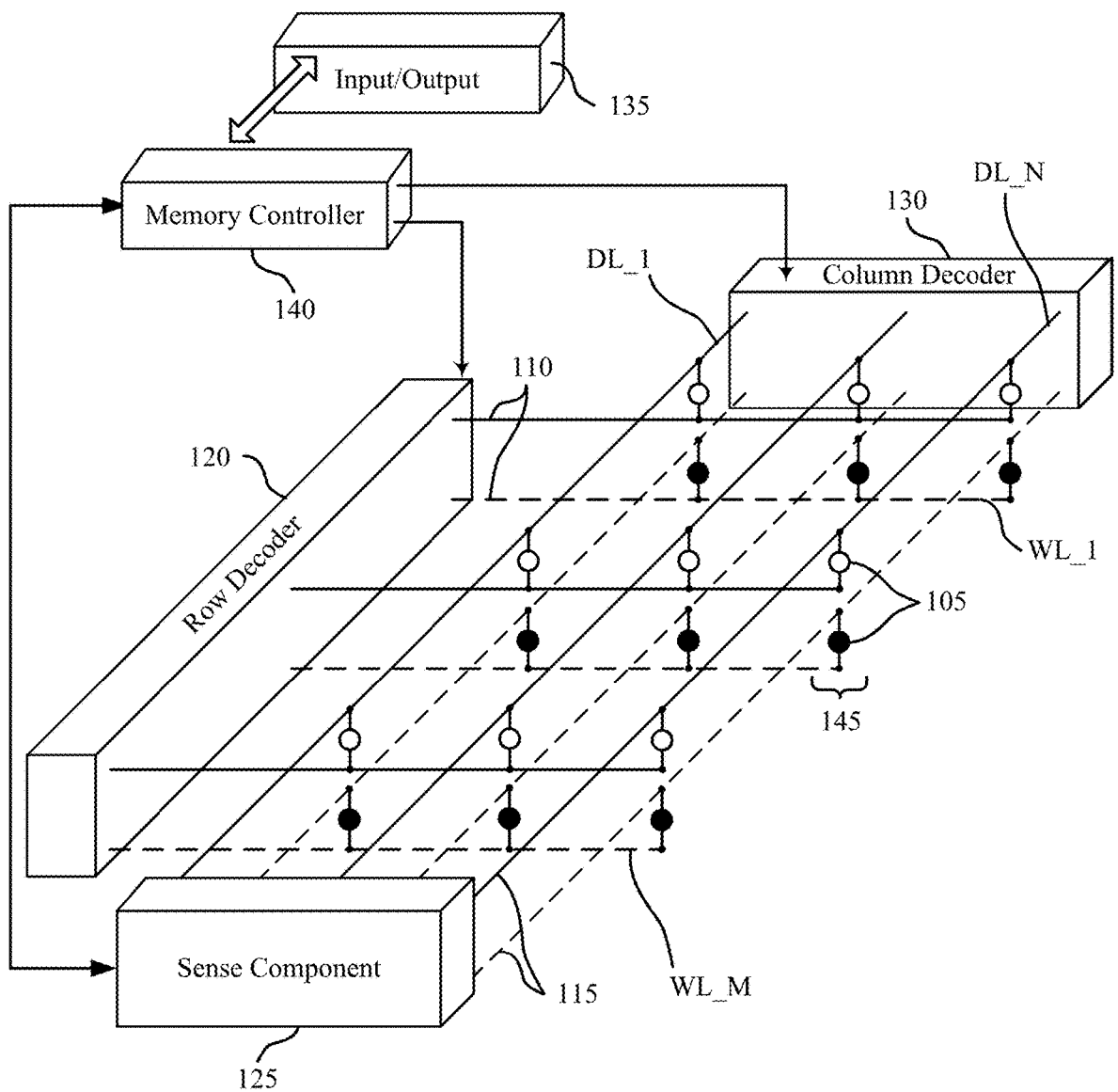
FIG. 1 illustrates an example of a memory device schematic diagram having a three-dimensional memory array of memory cells that supports multiple plate line architecture for multideck memory array in accordance with embodiments of the present disclosure.

A multideck memory device may be configured with plate lines or access lines, or both, coupled between and routed among various decks of the multideck memory device. This may allow non-volatile memory cells, such as ferroelectric memory cells, to be employed in the array. The multiple plate line architecture described here may result in increased memory cell density, increased read/write speeds, increased reliability, increased data retention, reduced power consumption, or reduced manufacturing costs.

By way of example, some memory devices are built using a memory array configuration having a cross-point architecture. In some examples, the architecture may be a two-dimensional cross-point architecture. In some examples, the architecture may be a three-dimensional cross-point architecture. A cross-point refers to a place where a memory cell is formed such that access lines associated with the memory cell topologically "cross" each other as access lines connect to different nodes of the memory cell. Cross-point architecture enables the theoretical minimum cell area determined by the minimum pitch of access lines. The three-dimensional cross-point architecture allows to construct more than one "deck" of array of memory cells, hence multideck memory array, overlying support circuitry built in a substrate layer. Within the three-dimensional cross-point architecture, memory devices may be configured of sections called memory tiles. Memory devices may be built by arranging the sections (e.g., memory tiles) in an array.

Each memory tile may include a similar configuration of components as the other memory tiles. Memory tiles may include a substrate layer that includes support circuitry including components such as decoders and sense elements, and memory cells positioned above the substrate layer. The substrate layer and components of support circuitry therein may be referred to as complementary metal-oxide-semiconductor (CMOS) under array (CuA). Additionally, memory tiles may include access lines to connect memory cells in the tile and the access lines may require connections to the support circuitry underneath. As more decks of memory array are positioned above the substrate layer, number of access lines and components (e.g., decoders) of support circuitry also increases such that efficient utilization of area may become challenging. In some cases, memory cell operation requires accessing more than two nodes of the memory cell at the same time, necessitating additional access lines routed to the memory cells and overall configuration of memory tiles may become even more challenging in multideck memory array as the number of support circuitry increases.

Techniques are described herein that support multiple plate line architecture for multideck memory array, which may provide efficient area utilization for overall configuration of memory tiles. As used herein, the techniques are described using ferroelectric memory cell with three access lines, namely plate line, digit line, and word line. Entire support circuitry components (e.g., decoders for the three access lines) may be placed under multidecks of array of ferroelectric memory cells, namely as a part of CuA, in some cases. Some of support circuitry components (e.g., decoders for plate line) may be placed in control circuit portion that is not a part of CuA. When some of support circuitry components are placed outside of CuA, the access lines associated with the support circuitry placed outside of CuA may require a novel scheme to reach memory cells in multideck memory array configuration.

Features of the disclosure introduced above are further described below in the context of memory device. Specific examples are then described for memory array and memory portions that relate to multiple plate line architecture for multideck memory array. These and other features of the disclosure are further illustrated by and described with reference to apparatus diagrams, system diagrams, and flowcharts that relate to multiple plate line architecture for multideck memory array.

FIG. 1 illustrates an example of a memory device schematic diagram having a three-dimensional memory array 100 of memory cells that supports multiple plate line architecture for multideck memory array in accordance with embodiments of the present disclosure. FIG. 1 is an illustrative schematic representation of various components and features of the memory array 100. As such, it should be appreciated that the components and feature of the memory array 100 are shown to illustrate functional interrelationships, not their actual physical positions within the memory array 100. Memory array 100 may also be referred to as an electronic memory apparatus. Memory array 100 includes memory cells 105 that are programmable to store different states. In some cases, memory cell 105 may be a ferroelectric memory cell that may include a capacitor with a ferroelectric material as the insulating material. In some cases, the capacitor may be referred to as a ferroelectric container. Each memory cell 105 may be programmable to store two states, denoted as a logic 0 and a logic 1. Each memory cell 105 may be stacked on top of each other resulting in two-decks of memory cell 145. Hence, the example in FIG. 1 may be an example that depicts two decks of memory array.

In some cases, memory cells 105 are configured to store more than two logic states. A memory cell 105 may store a charge representative of the programmable states in a capacitor; for example, a charged and uncharged capacitor may represent two logic states, respectively. DRAM architectures may commonly use such a design, and the capacitor employed may include a dielectric material with paraelectric or linear polarization properties as the insulator. By contrast, a ferroelectric memory cell may include a capacitor with a ferroelectric material as the insulating material. Different levels of charge of a ferroelectric capacitor may represent different logic states. Ferroelectric materials have non-linear polarization properties; some details and advantages of a ferroelectric memory cell 105 are discussed below.

Operations such as reading and writing, which may be referred to as access operations, may be performed on memory cells 105 by activating or selecting word line 110 and digit line 115. Word lines 110 may also be known as row lines, sense lines, and access lines. Digit lines 115 may also be known as bit lines, column lines, access lines. References to word lines and digit lines, or their analogues, are interchangeable without loss of understanding or operation. Word lines 110 and digit lines 115 may be perpendicular (or nearly perpendicular) to one another to create an array. Depending on the type of memory cell (e.g., FeRAM, RRAM, etc.), other access lines may be present (not shown), such as plate lines, for example. It should be appreciated that the exact operation of the memory device may be altered based on the type of memory cell and/or the specific access lines used in the memory device.

Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), etc.), metal alloys, carbon, conductively-doped semiconductors, or other conductive materials, alloys, compounds, or the like.

According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell. In some cases, word lines may be common between the upper deck and the lower deck of memory cells such that a word line may concurrently access both memory cells in the upper deck and the lower deck. In some cases, digit lines may be common in the similar manner such that a digit line may concurrently access both memory cells in the upper deck and the lower deck.

In some architectures, the logic storing device of a cell, e.g., a capacitor, may be electrically isolated from the digit line by a selector device. The word line 110 may be connected to and may control the selector device. For example, the selector device may be a transistor (e.g., thin-film transistor (TFT)) and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105. In addition, as described below in FIG. 2, access operation of ferroelectric memory cells may need an additional connection to a node of the ferroelectric memory cell, namely cell plate node via plate line.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed. In addition, access operation of ferroelectric memory cells may need to activate a corresponding plate line for the memory cell 105, associated with plate line decoder (not shown).

Figure 4:
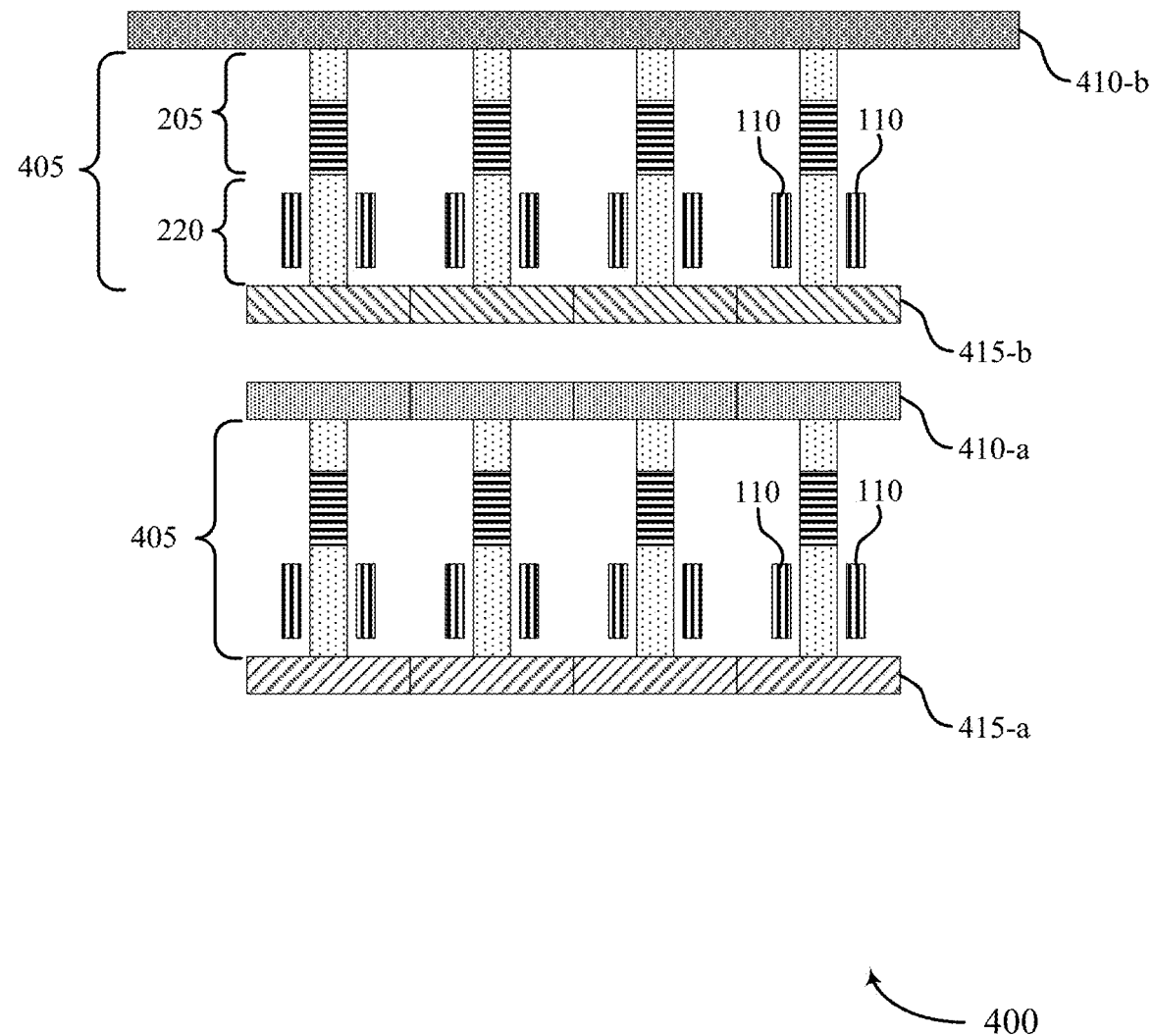
FIG. 4 illustrates an exemplary cross-sectional diagram of two-deck ferroelectric memory cells that supports multiple plate line architecture for multideck memory array in accordance with embodiments of the present disclosure.
Figure 5:
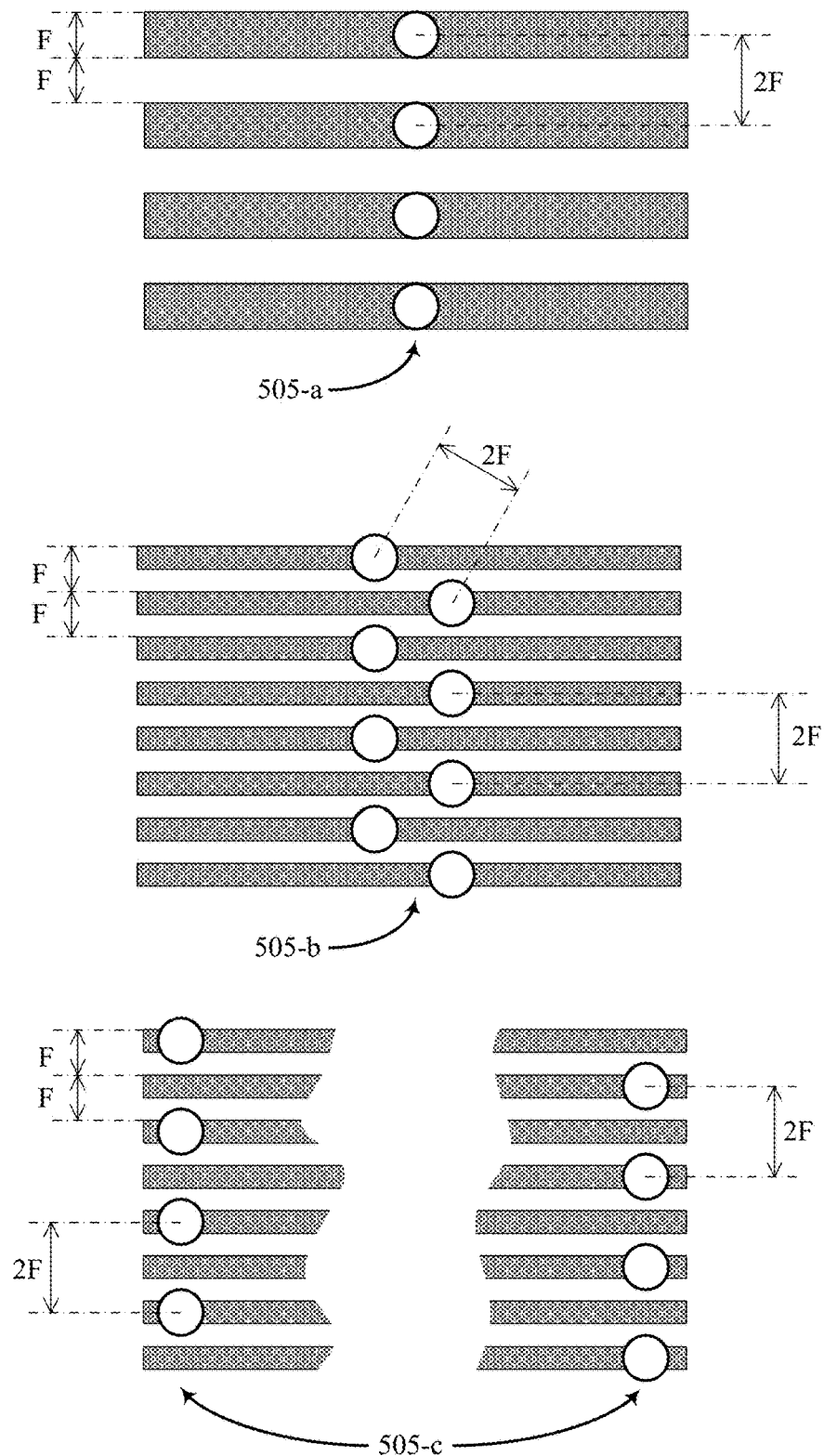
FIG. 5 illustrates top-down view examples of on pitch via (OPV) schemes that support multiple plate line architecture for multideck memory array in accordance with embodiments of the present disclosure.

Memory cells 105 may be access by selecting or energizing a plate line associated with and coupled to each cell. Different decks of the array 100 may be coupled to different plate lines. To facilitate plate line routing and other components of the multideck device, plate lines may be configured or oriented within the array as depicted in FIG. 4 below. As described herein, plate line routing may be facilitated using on pitch via (OPV) structures, examples of which are illustrated in FIG. 5 below. While not shown in the example of FIG. 1, those skilled in the art will appreciate the relationship and benefit of plate line orientation and OPV arrangements depicted in FIGS. 4 and 5 in the architecture in the exemplary multideck architecture depicted in FIG. 1. And as described below, FIGS. 7, 8, 9, 10, 11, and 12 also depict example component, plate line, and OPV orientations and arrangements that may be embodied in multideck device represented in FIG. 1.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may result from biasing, or applying a voltage, to the ferroelectric capacitor. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120.

A memory cell 105 may be set, or written, by similarly activating the relevant word line 110 and digit line 115—i.e., a logic value may be stored in the memory cell 105. Column decoder 130 or row decoder 120 may accept data, for example input/output 135, to be written to the memory cells 105. A ferroelectric memory cell 105 may be written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

In some memory architectures, including DRAM, memory cells may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells 105 may have beneficial properties that may result in improved performance relative to other memory architectures.

The memory controller 140 may control the operation (e.g., read, write, re-write, refresh, discharge, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory array 100. For example, it may apply discharge voltages to a word line 110 or digit line 115 after accessing one or more memory cells 105.

In general, the amplitude, shape, or duration of an applied voltage or current discussed herein may be adjusted or varied and may be different for the various operations discussed in operating memory array 100. Furthermore, one, multiple, or all memory cells 105 within memory array 100 may be accessed simultaneously; for example, multiple or all cells of memory array 100 may be accessed simultaneously during an access (or write or program) operation in which all memory cells 105, or a group of memory cells 105, are set or reset to a single logic state. It should be appreciated that the exact operation of the memory device may be altered based on the type of memory cell and/or the specific access lines used in the memory device. In some examples where other access lines e.g., plate lines, may be present (not shown), a corresponding plate line in collaboration with a word line and a digit line may need to be activated to access a certain memory cell 105 of the memory array. It should be appreciated that the exact operation of the memory device may vary based on the type of memory cell and/or the specific access lines used in the memory device.

Figure 2:
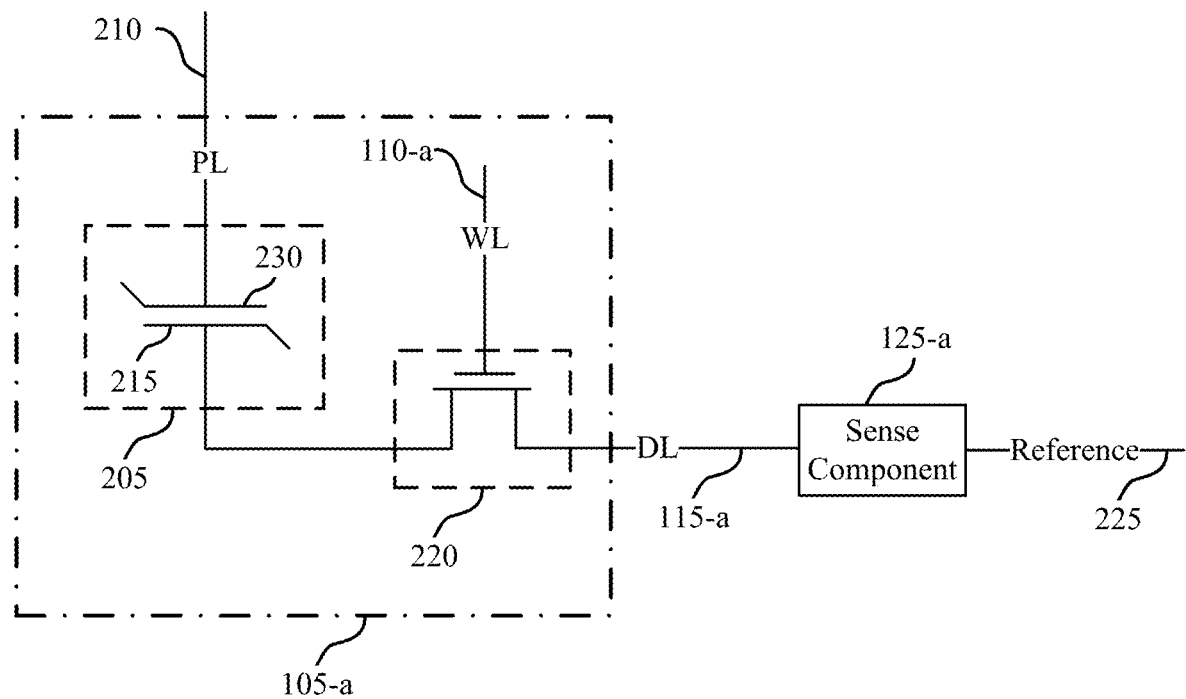
FIG. 2 illustrates an example of a ferroelectric memory cell and circuit components that supports multiple plate line architecture for multideck memory array in accordance with embodiments of the present disclosure.

FIG. 2 illustrates an example of a ferroelectric memory cell and circuit components that supports multiple plate line architecture for multideck memory array in accordance with embodiments of the present disclosure. Circuit 200 includes a memory cell 105-a, word line 110-a, digit line 115-a, and sense component 125-a, which may be examples of a memory cell 105, word line 110, digit line 115, and sense component 125, respectively, as described with reference to FIG. 1. Memory cell 105-a may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-a. Circuit 200 also includes selector device 220 and reference line 225. Cell plate 230 may be accessed via plate line 210 and cell bottom 215 may be accessed via digit line 115-a. As described above, various states may be stored by charging or discharging capacitor 205.

The stored state of capacitor 205 may be read or sensed by operating various elements represented in circuit 200. Capacitor 205 may be in electronic communication with digit line 115-a. For example, capacitor 205 can be isolated from digit line 115-a when selector device 220 is deactivated, and capacitor 205 can be connected to digit line 115-a when selector device 220 is activated. Activating selector device 220 may be referred to as selecting memory cell 105-a. In some cases, selector device 220 is a transistor (e.g., thin-film transistor (TFT)) and its operation is controlled by applying a voltage to the transistor gate, where the voltage magnitude is greater than the threshold voltage magnitude of the transistor. Word line 110-a may activate selector device 220; for example, a voltage applied to word line 110-a is applied to the transistor gate, connecting capacitor 205 with digit line 115-a.

In other examples, the positions of selector device 220 and capacitor 205 may be switched, such that selector device 220 is connected between plate line 210 and cell plate 230 and such that capacitor 205 is between digit line 115-a and the other terminal of selector device 220. In this embodiment, selector device 220 may remain in electronic communication with digit line 115-a through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-a. In one scheme, to sense the logic state stored by ferroelectric capacitor 205, word line 110-a may be biased to select memory cell 105-a and a voltage may be applied to plate line 210. In some cases, digit line 115-a is virtually grounded and then isolated from the virtual ground, which may be referred to as "floating," prior to biasing plate line 210 and word line 110-a. Biasing plate line 210 may result in a voltage difference (e.g., plate line 210 voltage minus digit line 115-a voltage) across capacitor 205. The voltage difference may yield a change in the stored charge on capacitor 205, where the magnitude of the change in stored charge may depend on the initial state of capacitor 205— e.g., whether the initial state stored a logic 1 or a logic 0. This may cause a change in the voltage of digit line 115-a based on the charge stored on capacitor 205. Operation of memory cell 105-a by varying the voltage to cell plate 230 may be referred to as "moving cell plate."

The change in voltage of digit line 115-a may depend on its intrinsic capacitance. That is, as charge flows through digit line 115-a, some finite charge may be stored in digit line 115-a and the resulting voltage may depend on the intrinsic capacitance. The intrinsic capacitance may depend on physical characteristics, including the dimensions, of digit line 115-a. Digit line 115-a may connect many memory cells 105 so digit line 115-a may have a length that results in a non-negligible capacitance (e.g., on the order of picofarads (pF)). The resulting voltage of digit line 115-a may then be compared to a reference (e.g., a voltage of reference line 225) by sense component 125-a in order to determine the stored logic state in memory cell 105-a. Other sensing processes may be used.

Sense component 125-a may include various transistors or amplifiers to detect and amplify a difference in signals, which may be referred to as latching. Sense component 125-a may include a sense amplifier that receives and compares the voltage of digit line 115-a and reference line 225, which may be a reference voltage. The sense amplifier output may be driven to the higher (e.g., a positive) or lower (e.g., negative or ground) supply voltage based on the comparison. For instance, if digit line 115-a has a higher voltage than reference line 225, then the sense amplifier output may be driven to a positive supply voltage. In some cases, the sense amplifier may additionally drive digit line 115-a to the supply voltage. Sense component 125-a may then latch the output of the sense amplifier and/or the voltage of digit line 115-a, which may be used to determine the stored state in memory cell 105-a, e.g., logic 1. Alternatively, if digit line 115-a has a lower voltage than reference line 225, the sense amplifier output may be driven to a negative or ground voltage. Sense component 125-a may similarly latch the sense amplifier output to determine the stored state in memory cell 105-a, e.g., logic 0. The latched logic state of memory cell 105-a may then be output, for example, through column decoder 130 as output 135 with reference to FIG. 1.

To write memory cell 105-a, a voltage may be applied across capacitor 205. Various methods may be used. In one example, selector device 220 may be activated through word line 110-a in order to electrically connect capacitor 205 to digit line 115-a. A voltage may be applied across capacitor 205 by controlling the voltage of cell plate 230 (through plate line 210) and cell bottom 215 (through digit line 115-a). To write a logic 0, cell plate 230 may be taken high, that is, a positive voltage may be applied to plate line 210, and cell bottom 215 may be taken low, e.g., virtually grounding or applying a negative voltage to digit line 115-a. The opposite process is performed to write a logic 1, where cell plate 230 is taken low and cell bottom 215 is taken high.

Figure 3:
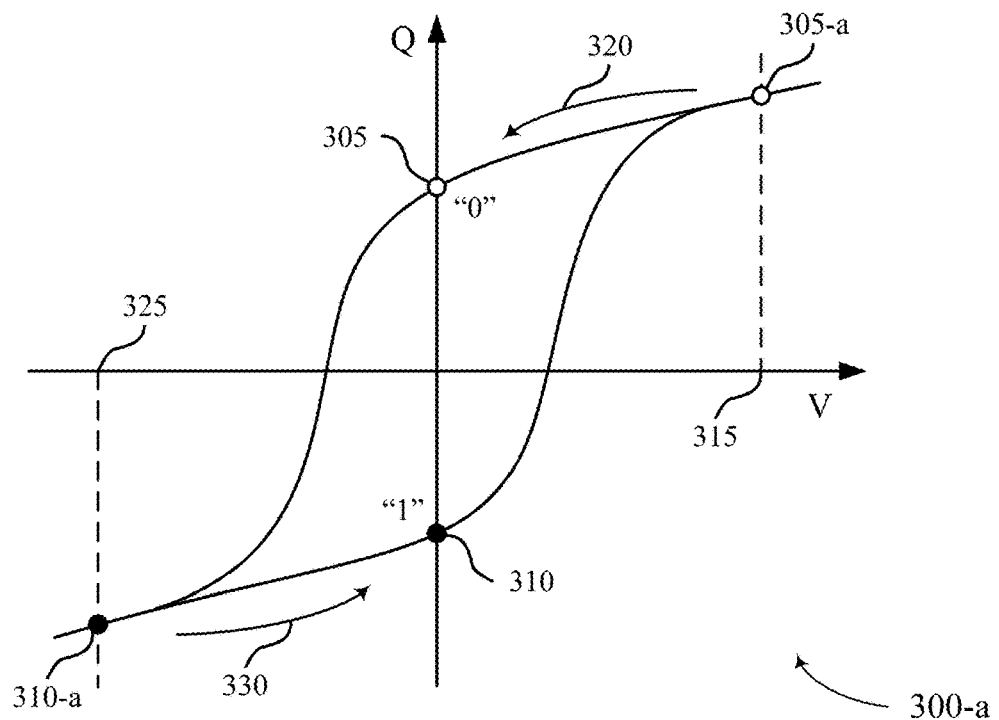
FIG. 3 illustrates an example of non-linear electrical properties with hysteresis curves for a ferroelectric memory cell that supports multiple plate line architecture for multideck memory array in accordance with embodiments of the present disclosure.
Figure 3:
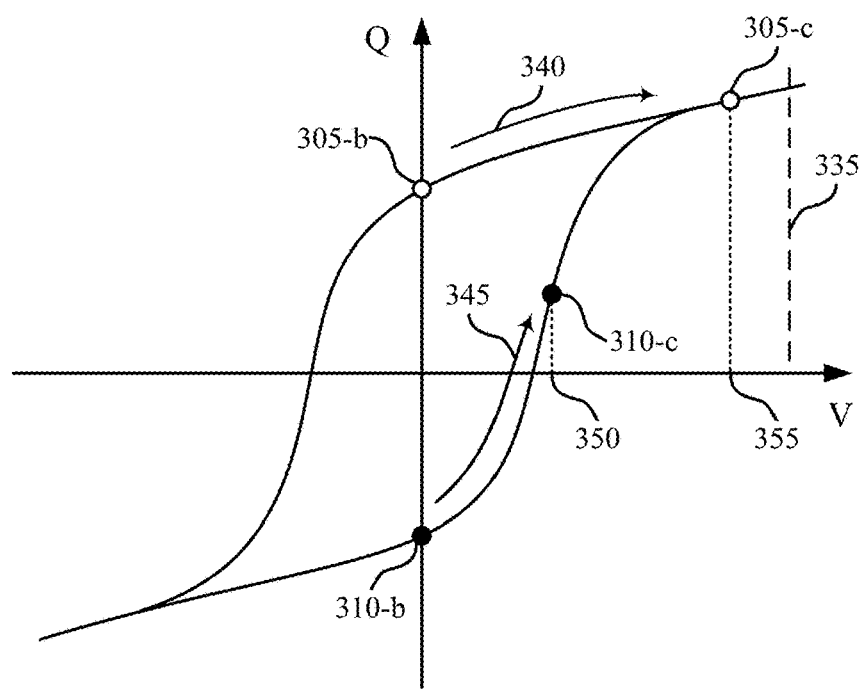

FIG. 3 illustrates an example of non-linear electrical properties with hysteresis curves 300-a and 300-b for a ferroelectric memory cell that supports multiple plate line architecture for multideck memory array in accordance with embodiments of the present disclosure. Hysteresis curves 300-a and 300-b illustrate an example ferroelectric memory cell writing and reading process, respectively. Hysteresis curves 300 depict the charge, Q, stored on a ferroelectric capacitor (e.g., capacitor 205 of FIG. 2) as a function of a voltage difference, V.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300 may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage. Similarly, charge state 310 is written by applying a net negative voltage 325, which results in charge state 310-a. After removing negative voltage 325, charge state 310-a follows path 330 until it reaches charge state 310 at zero voltage. Charge states 305-a and 310-a may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-b or 310-b was initially stored. For example, hysteresis curve 300-b illustrates two possible stored charge states 305-b and 310-b. Voltage 335 may be applied across the capacitor as discussed with reference to FIG. 2. In other cases, a fixed voltage may be applied to the cell plate and, although depicted as a positive voltage, voltage 335 may be negative. In response to voltage 335, charge state 305-b may follow path 340. Likewise, if charge state 310-b was initially stored, then it follows path 345. The final position of charge state 305-c and charge state 310-c depend on a number of factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not be equal to voltage 335 and instead may depend on the voltage of the digit line. The position of final charge states 305-c and 310-c on hysteresis curve 300-b may thus depend on the capacitance of the digit line and may be determined through a load-line analysis—i.e., charge states 305-c and 310-c may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., (voltage 335-voltage 350) or (voltage 335-voltage 355). A reference voltage may be generated such that its magnitude is between the two possible voltages of the two possible digit line voltages in order to determine the stored logic state—i.e., if the digit line voltage is higher or lower than the reference voltage. For example, the reference voltage may be an average of the two quantities, (voltage 335-voltage 350) and (voltage 335-voltage 355). Upon comparison by the sense component, the sensed digit line voltage may be determined to be higher or lower than the reference voltage, and the stored logic value of the ferroelectric memory cell (i.e., a logic 0 or 1) may be determined.

As discussed above, reading a memory cell that does not use a ferroelectric capacitor may degrade or destroy the stored logic state. A ferroelectric memory cell, however, may maintain the initial logic state after a read operation. For example, if charge state 305-*b* is stored, the charge state may follow path 340 to charge state 305-*c* during a read operation and, after removing voltage 335, the charge state may return to initial charge state 305-*b* by following path 340 in the opposite direction.

FIG. 4 illustrates an exemplary cross-sectional diagram of two-deck ferroelectric memory array 400 that supports multiple plate line architecture for multideck memory array in accordance with embodiments of the present disclosure. The cross-section view of array 400 may be considered as a cross-section view of a series of two-deck ferroelectric memory cells 145 along the digit line 115 direction (e.g., four two-deck ferroelectric memory cells are depicted in FIG. 4) as described with reference to FIG. 1. The cross-section view illustrates components above CuA only, such as access lines and ferroelectric memory cells, but those skilled in the art will recognize that CuA may underlie the illustrated components. Digit lines associated with different decks are illustrated to be positioned at different heights in the cross-section view. Each ferroelectric memory cell 405 may be described as a memory cell with three nodes and each node is connected to a digit line 415, a plate line 410, and a word line 110. The digit line and the plate line may be examples of a digit line 115 and a plate line 210 as described with reference to FIG. 1 and FIG. 2. It should be appreciated that word lines 110 extend in a direction substantially orthogonal to digit line direction. Plate lines extend in the same direction as digit line direction. In some cases, access lines may not be straight, by design, to achieve efficient layout or due to process limitations. As such, word lines 110 may not extend in a direction precisely orthogonal to digit line direction.

A ferroelectric memory cell 405 may be formed in the space between digit lines and plate lines. The ferroelectric memory cell further comprises a ferroelectric capacitor 205 and a selector device 220 as described with reference to FIG. 2. The ferroelectric capacitor may be referred to as a ferroelectric container. The selector device 220 may be a transistor (e.g., thin-film transistor (TFT)) and the gate of the transistor may be connected to word lines, 110. A ferroelectric memory cell may be repeated to form an array of ferroelectric memory. It should be appreciated that the cross-section in FIG. 4 represents the global plate line 410-*b* may be continuous and longer than the local plate line 410-*a*.

Figure 10:
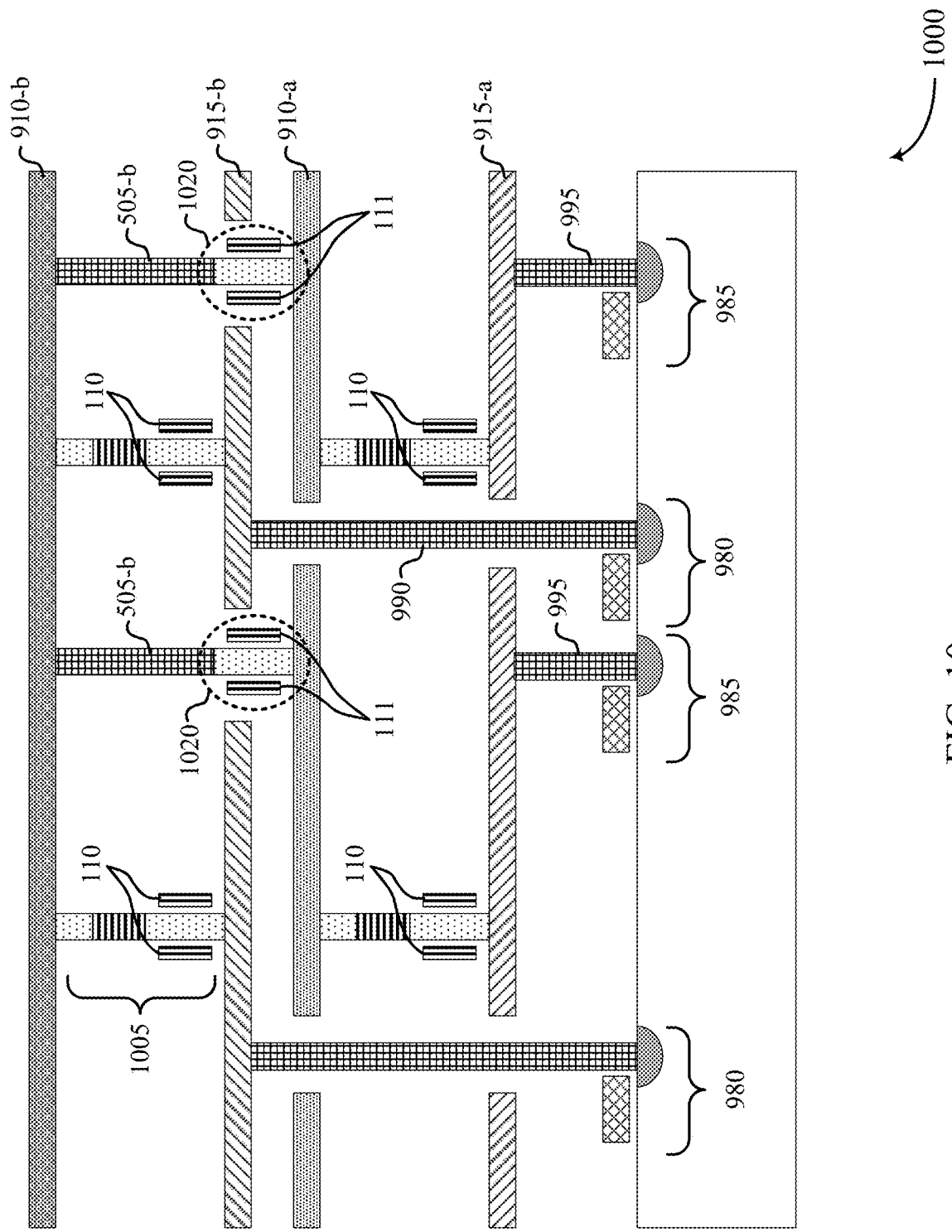
FIG. 10 illustrates an exemplary cross-sectional diagram of two-deck ferroelectric memory cells of a memory device that supports multiple plate line architecture for multideck memory array in accordance with embodiments of the present disclosure.
Figure 11:
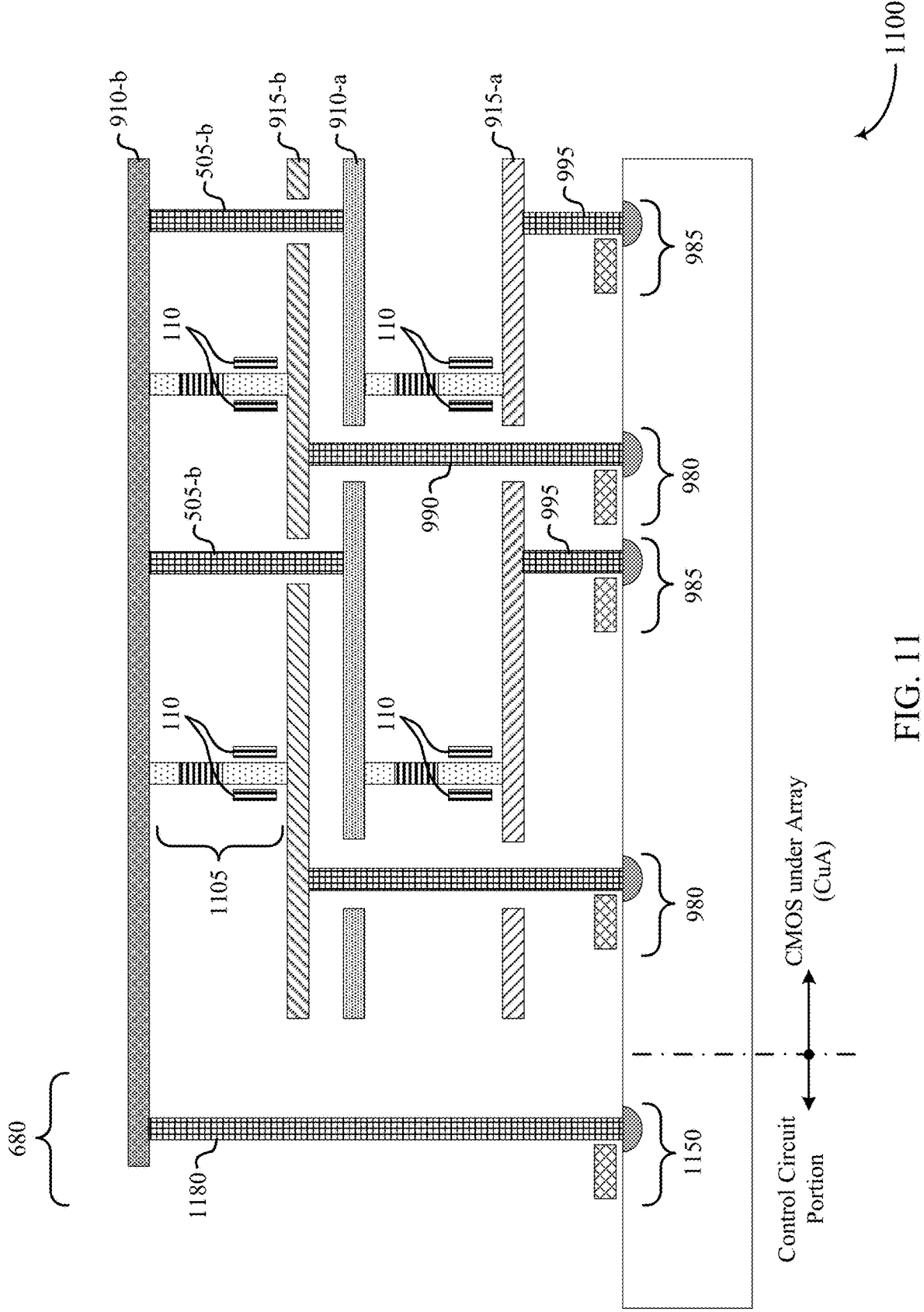
FIG. 11 illustrates an exemplary cross-sectional diagram of two-deck ferroelectric memory cells of a memory device that supports multiple plate line architecture for multideck memory array in accordance with embodiments of the present disclosure.
Figure 12:
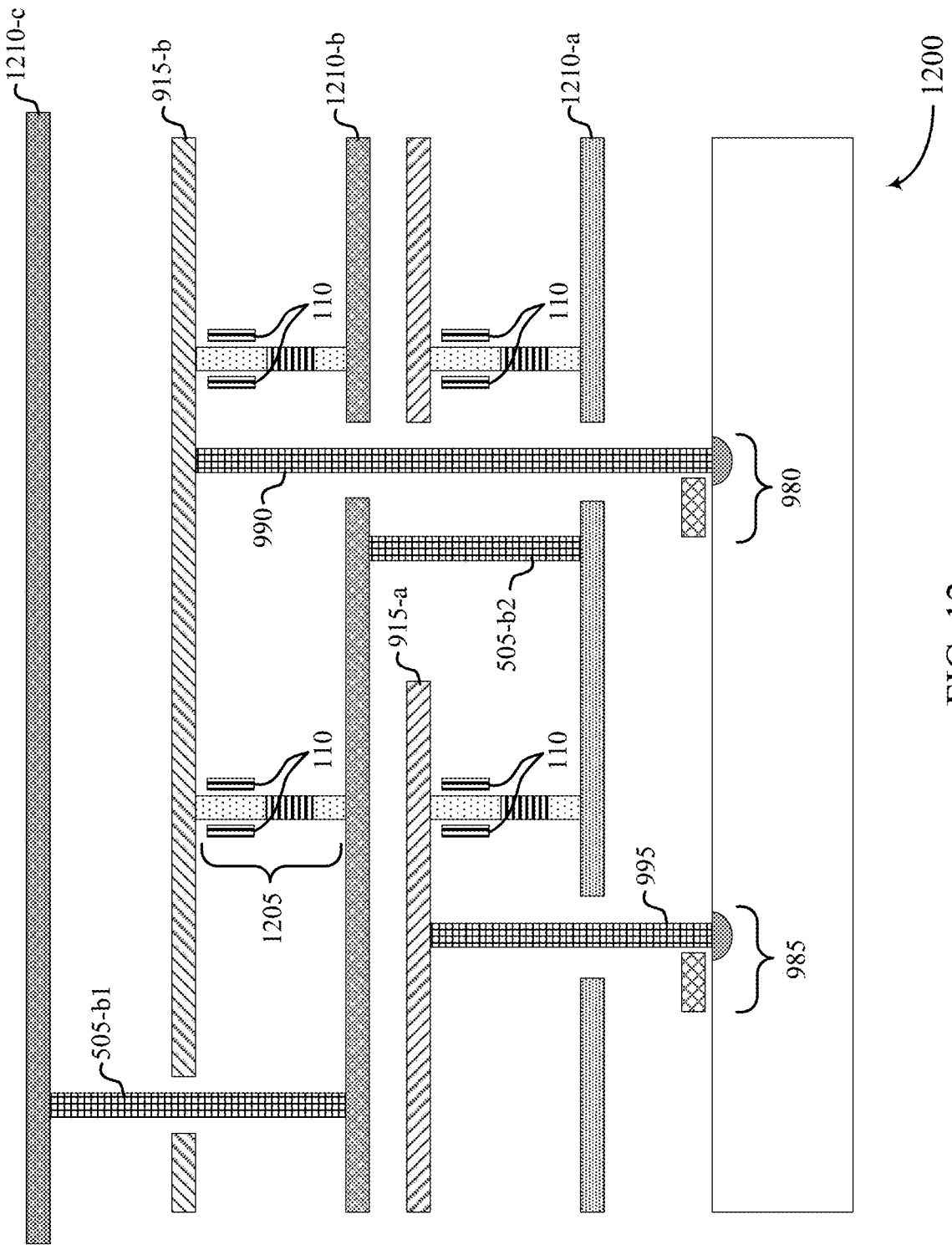
FIG. 12 illustrates an exemplary cross-sectional diagram of two-deck ferroelectric memory cells of a memory device that supports multiple plate line architecture for multideck memory array in accordance with embodiments of the present disclosure.

It should be appreciated that the first and the second decks of the three-dimensional arrays may be substantially the same from the memory cell point of view as illustrated in FIG. 4 and FIGS. 9-12. In other words, in some examples, the memory cells of each deck are constructed by duplicating the same fabrication process modules, e.g., word lines and then ferroelectric capacitors as depicted in FIG. 4 and FIGS. 9-11, or vice-versa, as depicted in FIG. 12. Hence, each deck in multideck memory architecture may be constructed with ferroelectric capacitors oriented in the same direction. Fabrication process considerations from manufacturing point of view may determine a particular orientation of the ferroelectric capacitors.

FIG. 5 illustrates exemplary top-down or plan views of on pitch via (OPV) schemes 500 that supports multiple plate line architecture for multideck memory array in accordance with embodiments of the present disclosure. Via structures may be referred to as contact structures. Via 505-*a* structures with a conventional configuration show via structures landing on line structures. When both via structures and line structures are patterned with the minimum feature size F of a given technology node, the minimum pitch of 2F is maintained for both structures. However, when line structures are patterned using a pitch multiplication technique, e.g., self-aligned double patterning (SADP) technique, the minimum feature size of line structures may be reduced to one-half of the original minimum feature size, namely ½ F. As a result, the line structures have a new minimum pitch of F while the via structures have the minimum pitch of 2F.

On pitch via (OPV) 505-*b* structures with a different configuration may be utilized to resolve the mismatch in the minimum pitches between via structures and line structures. The OPV 505-*b* structures enable the via structure patterning done satisfying the minimum pitch requirement of a given technology node while each line structure is constructed to have a via structure associated with it. Alternatively, OPV 505-*c* structures may be utilized. OPV 505-*c* structures may be used to connect two separate groups of support circuit components (e.g., decoders) with two group of access lines, e.g., access lines with even addresses and odd addresses.

Figure 6:
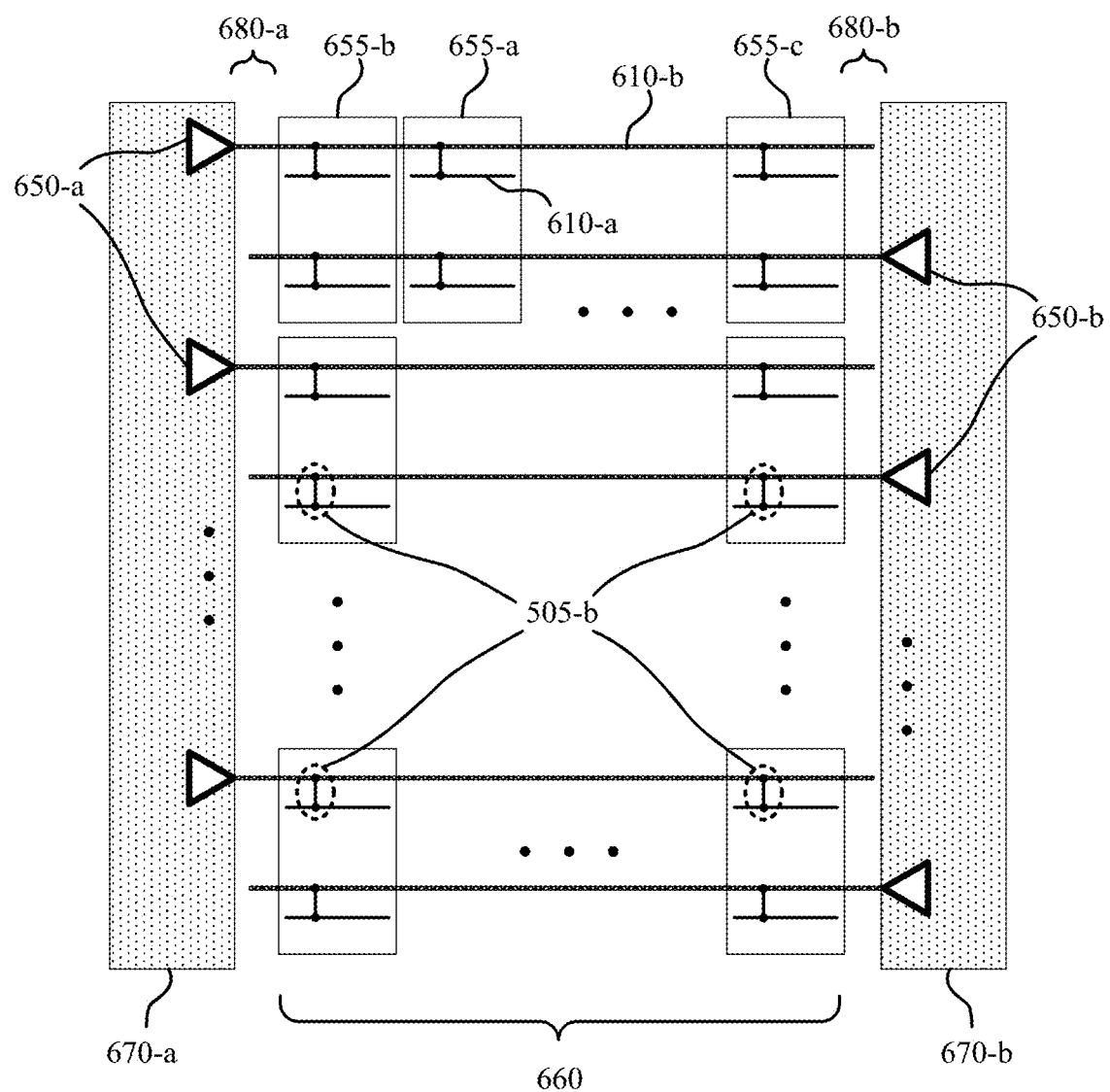
FIG. 6 illustrates an exemplary schematic diagram of ferroelectric memory array architecture of a memory device that supports multiple plate line architecture for multideck memory array in accordance with embodiments of the present disclosure.
Figure 6:
Figure 6:
Figure 6:
Figure 6:

FIG. 6 illustrates an exemplary schematic diagram of ferroelectric memory array architecture 600 of a memory device that supports multiple plate line architecture for multideck memory array in accordance with embodiments of the present disclosure. As depicted in FIG. 6, memory array 660 may include array of memory tiles 655. Each memory tile may have a similar configuration such that their repetitive arrangement constructs a contiguous memory array as illustrated below with reference to FIG. 7. The memory array 660 may be adjacent to control circuit portions 670 where one or more circuit components (e.g., plate line decoders 650) may be placed. As FIG. 6 illustrates a top-down view of a portion of a memory device, it only illustrates overall layout of memory tiles, control circuit portions including plate line decoders, and a few plate lines for clarity.

In some cases, each memory tile may include two decks of ferroelectric memory arrays as describe with reference to FIGS. 1 and 4 as well as support circuitry underneath the memory array (e.g., CuA) where one of more decoders (e.g., word line decoders, digit line decoders, etc.) may be placed. Additionally, each memory tile may include access lines associated with the memory cells. In some examples, a memory tile may include approximately 4 million ferroelectric memory cells in two-decks of memory array, which in turn may translate to 2048 word lines, 2048 digit lines, and 2048 plate lines within the tile. Actual size of memory tile and memory array may depend on various requirements determined by performance and capacity specifications. As depicted in the exemplary schematic diagram of FIG. 6, only two plate lines for a lower deck and two plate lines for an upper deck are drawn for each memory tile for illustrational purpose. Global plate lines 610-*b* may be examples of plate line 410-*b* as described with reference to FIG. 4. Local plate lines 610-*a* may be examples of plate line 410-*a* as described with reference to FIG. 4. As each memory tile may include word line decoders and digit line decoders in CuA underneath the memory array, accessing memory cells of a memory tile 655-*a* via word lines and digit lines may be achieved by word line decoders and digit line decoders of the memory tile 655-*a* or decoders residing in adjacent memory tiles 655-*b*. However, accessing memory cells via plate lines may need to be externally routed from the control circuit portions 670 as plate line decoders 650 may be placed in the control circuit portions to avoid unreasonable complexity or undesirable CuA area, hence a memory tile area, increase in memory tile construction.

As depicted in an exemplary schematic diagram of FIG. 6, plate line decoders may be grouped into two groups. One group of plate line decoders 650-*a* may be associated with even-numbered plate line addresses of memory cells and placed in a control circuit portion 670-*a*. The other group of plate line decoders 650-*b* may be associated with odd-numbered plate line addresses of memory cells and placed in a control circuit portion 670-*b*. Plate line decoders may be associated with plate lines of memory cells in upper deck that may be referred to as "global" plate lines. Global plate lines 610-*b* extend across more than one memory tile providing "global" access across the multiple memory tiles connected thereto. In some cases, global plate lines may be the top most plate lines of the multi-deck memory device. Other configurations are possible; for example, plate line decoders may be, at least partially, implemented in CuA and/or they may be shared between adjacent memory arrays.

Connection between plate line decoders 650 and global plate lines 610-*b* may be achieved by the OPVs 505-*c* as described with reference to FIG. 5 in order to accommodate the minimum pitch difference between via structures (e.g., OPVs) and line structures (e.g., global plate lines). The areas where the OPVs 505-*c* make connection to global plate lines are denoted as areas 680 in FIG. 6. A cross-sectional example of the area 680 may be found in FIG. 11 where OPVs 1180 connect global plate line to plate line decoders in control circuit portion. In addition, as schematically depicted in FIG. 6, a single global plate line 610-*b* may connect to multiple local plate lines 610-*a* of memory cells in lower deck. The plate lines 610-*a* that are associated with the lower deck memory cells may be referred to as "local" plate lines in contrast to "global" plate lines because local plate lines 610-*a* may not extend beyond a memory tile. Local plate lines 610-*a* may be an example of plate line 410-*a* as described with reference to FIG. 4. Connection between global plate lines 610-*b* and local plate lines 610-*a* may be achieved by OPVs 505-*b* as described with reference to FIG. 5 in order to accommodate the minimum pitch difference between via structures and line structures. It should be appreciated that OPVs 505-*b* (although drawn as lateral features in top-down view of FIG. 6) are vertical features with respect to substrate layer in its construction. In other words, OPVs 505-*b* connect local plate line 610-*a* and global plate line 610-*b* that are positioned spatially on top of each other as illustrated in various cross-section views in FIGS. 4 and 9 through 12. Further details of memory tile configuration are described in FIGS. 7 and 8.

Figure 7:
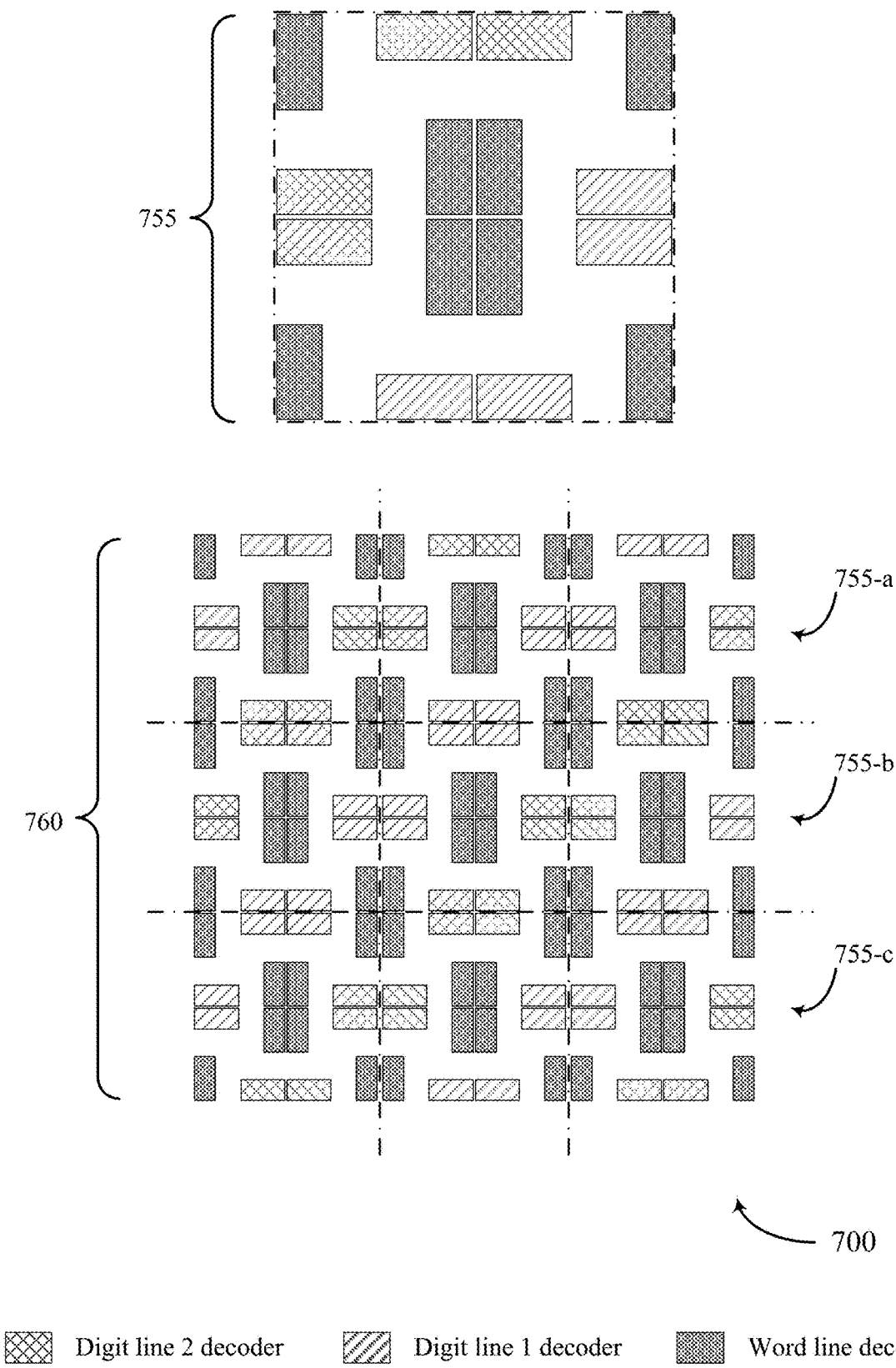
FIG. 7 illustrates an example of a memory tile configuration of a memory device that supports multiple plate line architecture for multideck memory array in accordance with embodiments of the present disclosure.

FIG. 7 illustrates an example of a memory tile configuration 700 of a memory device that supports multiple plate line architecture for multideck memory array in accordance with embodiments of the present disclosure. FIG. 7 illustrates only some of components in the substrate layer of a memory tile for clarity purposes. A memory tile 755 may include support circuitry components, e.g., word line decoders and digit line decoders, as a part of CuA. In some examples, CuA may include additional components such as plate line decoders, sense amplifiers, etc. Support circuit components in a memory tile need to be arranged such a way to allow that repetitive arrangements of the memory tiles in both horizontal and vertical directions would construct uniform patterns of support circuitry components as a whole. As an example, FIG. 7 illustrates an exemplary 3 by 3 repetition 760 of a tile 755. This configuration of memory tiles, also referred to a quilt architecture in light of similarity in the process of stitching a large quilt by using multitudes of its smaller constituents, enables flexible memory array size construction by simply repeating memory tiles just like building a quilt by repeating its constituents. It should be appreciated that periodic pattern of decoders, and thus CuA components, emerges by repeating memory tiles in both horizontal and vertical directions. For example, an alternating pattern including word line decoders, digit line 1 decoders, and digit line 2 decoders may emerge in both horizontal and vertical directions.

Figure 8:
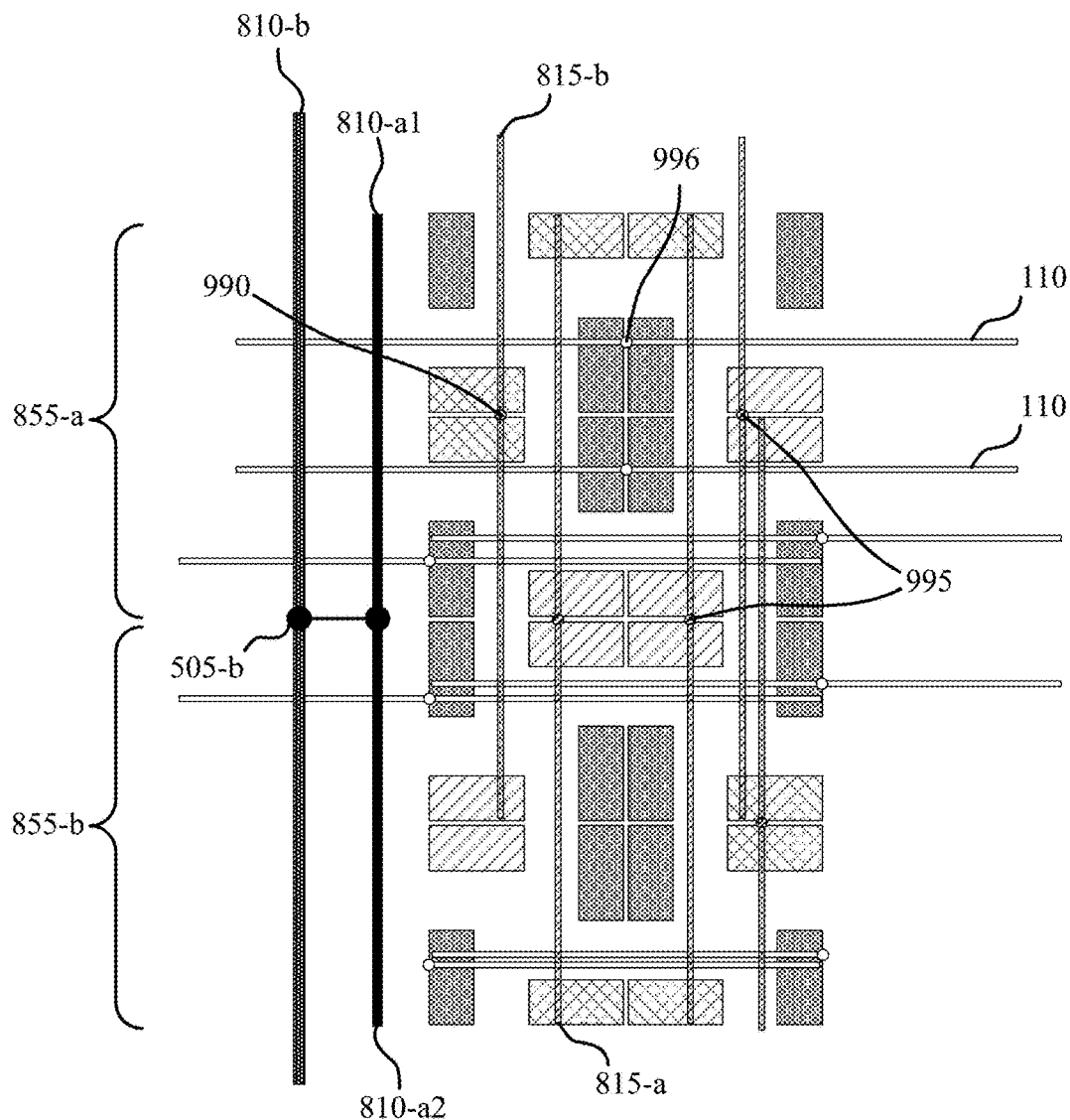
FIG. 8 illustrates an example of a memory tile configuration of a memory device that supports multiple plate line architecture for multideck memory array in accordance with embodiments of the present disclosure.

FIG. 8 illustrates an example of a memory tile configuration 800 of a memory device that supports multiple plate line architecture for multideck memory array in accordance with embodiments of the present disclosure. FIG. 8 illustrates only several components in the substrate layer of a memory tile in addition to several access lines for clarity purposes. Digit lines and plate lines may be spatially placed on top of each other extending in one direction as shown in cross section views of FIGS. 4 and 9 through 12. At the same time, word lines may extend in a substantially orthogonal direction with respect to digit lines and plate lines while word lines associated with memory cells of upper deck may be spatially placed on top of word lines associated with memory cells of lower deck. Hence, top-down view representing all access lines into a two-dimensional diagram may become unreasonably complex. In some cases, access lines may not be straight by design to achieve efficient layout or due to process limitations. As such, word lines may not extend in a direction precisely orthogonal to digit line direction.

Only two memory tiles 855-*a* and 855-*b* are shown in FIG. 8 for clarity. Memory tiles 855 may be examples of memory tiles 655 and 755 as described with reference to FIGS. 6 and 7. In FIG. 8, only a few word lines 110 are drawn to illustrate that word lines may extend beyond a memory tile border so that word lines of a memory tile may be associated with memory cells located within the memory tile or memory cells located in an adjacent memory tile. By the same token, only a few digit lines 815 are drawn to illustrate that digit lines may extend beyond a memory tile border so that digit lines of a memory tile may be associated with memory cells located within the memory tile or memory cells in an adjacent memory tile. Digit line 815-*a* may be an example of digit line 415-*a* and digit line 815-*b* an example of digit line 415-*b* as described with reference to FIG. 4. Contact 990, 995 features may be examples of contacts connecting between digit lines and digit line decoders in CuA as illustrated below in FIG. 9-11. Similar contact 996 features connecting word lines to corresponding word line decoders are also shown.

FIG. 8 also illustrates a global plate line 810-*b* and local plate lines 810-*a* for each memory tile 855-*a* and 855-*b* (810-*a*1 and 810-*a*2, respectively). Global plate line 810-*b* may be an example of global plate lines 410-*b* and 610-*b* as described with reference to FIGS. 4 and 6. Local plate lines 810-*a* may be examples of local plate lines 410-*a* and 610-*a* as described with reference to FIGS. 4 and 6. The local plate lines 810-*a* may not extend beyond a memory tile border while the global plate line 810-*b* may extend over multiple memory tiles without a break. The OPVs 505-*b* may connect global plate line 810-*b* to the local plate lines 810-*a*1 and 810-*a*2 that are confined within a memory tile to provide access to the memory cells in a lower deck of memory array. Hence, the global plate line 810-*b* connected to the local plate lines 810-*a*1 and 810-*a*2 provides access to the memory cells in a lower deck of memory array. The global plate lines may be associated with plate line decoders placed in control circuit portion so as to enable plate line decoders to collaborate together with word line decoders and digit line decoders in CuA of memory tiles to access memory cells in both upper deck and lower deck. It should be appreciated that OPVs 505-*b* (although drawn as a lateral feature in top-down view of FIG. 8) are vertical features with respect to the substrate layer in its physical construction. In other words, OPVs 505-*b* connect local plate line 810-*a* and global plate line 810-*b* that are positioned spatially on top of each other as illustrated in various cross-section views in FIGS. 4 and 9 through 12.

Figure 9:
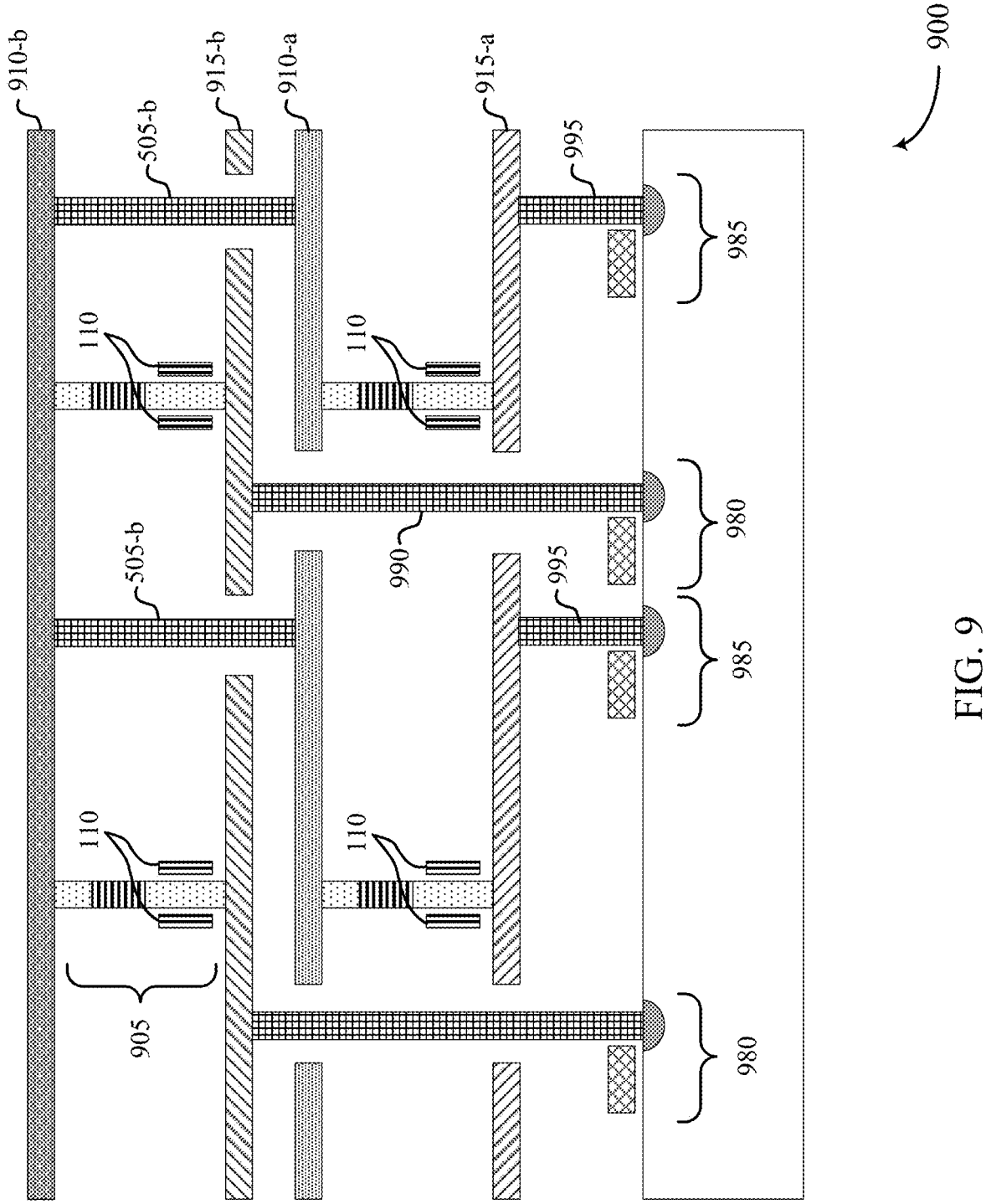
FIG. 9 illustrates an exemplary cross-sectional diagram of two-deck ferroelectric memory cells of a memory device that supports multiple plate line architecture for multideck memory array in accordance with embodiments of the present disclosure.

FIG. 9 illustrates an exemplary cross-sectional diagram of two-deck ferroelectric memory cells 900 of a memory device that supports multiple plate line architecture for multideck memory array in accordance with embodiments of the present disclosure. The cross-section view illustrates selected components in the substrate layer and access lines for clarity in addition to a few ferroelectric memory cells 905 and word lines 110 associated with them. Spaces between plate lines and digit lines are where array of ferroelectric memory cells 905 may be formed although only four of them are illustrated for clarity. Lower deck digit line decoders 985 and upper deck digit line decoders 980 are illustrated as a part of CuA in the substrate layer. As the decoders in CuA are typically built using CMOS field effect transistors (FETs), a symbolic cross section of a FET (e.g., gate, source or drain, and contact structures) is illustrated to represent decoder circuits. There may be other CuA components in the substrate layer such as word line decoders, sense amplifiers, etc. (not shown). In some cases, plate line decoders may be included in CuA of a memory tile. Contacts 995 may connect lower deck digit line decoders 985 to lower deck digit lines 915-*a*. Lower deck digit lines 915-*a* may be examples of lower deck digit lines 415-*a* and 815-*a* as described with reference to FIGS. 4 and 8. In addition, contacts 990 may connect upper deck digit line decoders 980 to upper deck digit lines 915-*b*. Upper deck digit lines 915-*b* may be examples of upper deck digit lines 415-*b* and 815-*b* as described with reference to FIGS. 4 and 8. Contacts 990 may be a single contact or a stacked contact. In some cases, word line decoders (not shown) in the CuA of a memory tile may connect to word lines 110 through via or contact configuration such that word line decoders may be associated with the word lines 110. In some cases word lines for both decks may be connected so that the word line decoders may concurrently access both word lines of the memory cells in both upper deck and lower deck.

FIG. 9 also illustrates that global plate line 910-*b* may provide access to the cells in both lower deck and upper deck. Global plate line 910-*b* may be an example of global plate lines, 410-*b*, 610-*b*, and 810-*b* as described with reference to FIGS. 4, 6, and 8. Global plate line 910-*b* may be associated with plate line decoders in control circuit portion as illustrated in FIGS. 6 and 11. Global plate line 910-*b* may connect to local plate lines 910-*a* through OPV 505-*b*. It should be appreciated that global plate line that is associated with plate line decoders in control circuit portion may provide "tops-down" connection to the plate lines of the memory cells in upper and lower decks of memory while other decoders (e.g., digit line decoders and word line decoders) in CuA of memory tile provide "bottoms-up" connection to the digit lines and word lines for the memory cells in upper and the lower decks of memory. Hence, collaborations between "tops-down" and "bottoms-up" connections described above provide all the necessary access lines to the memory cells in a multideck memory configuration without having to incur undesired increase in CuA area of memory tiles in an effort to include undue number of CuA components. In some cases, word line decoders or digit line decoders may be placed in the control circuit portion instead of plate line decoders. In some cases, more than one CuA components may be placed in the control circuit portion when such arrangement may provide a more efficient memory tile configuration depending on different features and requirements of various memory technology.

Overall configuration of various access lines, contacts, and OPVs depicted in FIG. 9 may be described as vertically interleaved "T" and "inverted T" electrical paths formation, which may refer to the physical shape of the configuration. For example, contacts 990 connected to upper deck digit lines 915-*b* may be viewed as "T" configuration while OPVs 505-*b* connected to local plate lines 910-*a* as "inverted T" configuration. By way of example, the "T" configuration brings a first signal from a lower signal source (e.g., upper deck digit line decoders 980 in CuA) to an access line of an upper deck while the "inverted T" configuration brings a second signal from an upper signal source (e.g., global plate line 910-*b* driven by plate line decoders in control circuit portion) to an access line of a lower deck. It should be appreciated that digit lines 915 and local plate lines 910-*a* may be interleaved so as to enable contacts and OPVs make appropriate connections, e.g., contacts 990 to upper deck digit lines 915-*b* and OPVs 505-*b* to local plate lines 910-*a*. The digit lines and plate lines, positioned at different heights from the substrate, may run parallel to each other and substantially overlap from top down point of view. In some cases, portions of digit lines overlie portions of plate lines.

FIG. 10 illustrates an exemplary cross-sectional diagram of two-deck ferroelectric memory cells 1000 of a memory device that supports multiple plate line architecture for multideck memory array in accordance with embodiments of the present disclosure. Overall configuration of the cross-section is the same as FIG. 9. However, FIG. 10 illustrates that OPVs connecting between global plate line 910-*b* and local plate lines 910-*a* may include a selector device 1020 so as to provide another degree of freedom in terms of selectively accessing memory cells in lower deck of memory arrays. The selector device may be TFT. In some examples (not shown), the selector device 1020 may be at the same height as and may be concurrently formed with word lines 110. Additional access lines (e.g., OPV access lines) may be coupled to the gate of the TFT in the OPV in order to provide control of the TFT in selectively connecting global plate line 910-*b* and local plate lines 910-*a*. Additional decoders (e.g., OPV access line decoders, not shown) that are associated with OPV access lines may be necessary to be placed either as a part of CuA or in control circuit portion.

FIG. 11 illustrates an exemplary cross-sectional diagram of two-deck ferroelectric memory cells 1100 of a memory device that supports multiple plate line architecture for multideck memory array in accordance with embodiments of the present disclosure. Overall configuration of the cross section is the same as FIG. 9. FIG. 11 illustrates that plate line decoders 1150 placed in control circuit portion may be associated with the global plate line 910-*b* to provide access to the memory cells of both lower deck and upper deck without having to have plate line decoders placed in CuA of memory tile. Plate line decoders 1150 may be examples of plate line decoders 650 placed in control circuit portions 670 as described with reference to FIG. 6. OPVs 1180 may connect the global plate line 910-*b* and plate line decoder 1150. OPVs 1180 may be examples of OPVs 505-*c* as described with reference to FIG. 5. OPVs 1180 may be a single via or a stacked via. It should be appreciated that memory cells are absent above the control circuit portion and plate line decoders 1150 may not be a part of CuA of a memory tile. Global plate line 910-*b* may be associated with memory cells having even numbered addresses while the global plate lines associated with memory cells having odd numbered addresses may be placed next (not shown). The border between CuA of memory tile and control circuit portion may not be as precise as shown in FIG. 11. In some examples, the borders may be substantially aligned with the decoders' edge in CuA of memory tiles and the array of memory cells may be within a footprint of the decoders. In other examples, the border may be substantially aligned with the edge of the array of memory cells and the decoders in CuA may be within a footprint of the array of memory cells.

In some cases, the memory device, which may be referred to as an electronic memory device, may include a first array of memory cells configured in a cross point architecture, the first array comprising a plurality of sections, each cell of the first array comprising a ferroelectric memory cell coupled with an access line oriented in a first direction and an access line oriented in a second direction that may be substantially orthogonal to the first direction, a first plate line oriented in the first direction and coupled with ferroelectric memory cells in two or more sections of the first array, a second array of memory cells configured in the cross point architecture, the second array comprising a plurality of sections, wherein the first array overlies the second array, each cell of the second array comprising a ferroelectric memory cell coupled with an access line oriented in the first direction and an access line oriented in the second direction, a plurality of second plate lines oriented in the first direction, each of the second plate lines coupled with the first plate line and ferroelectric memory cells of a section of the second array, and support circuitry coupled with the first array and the second array. In some cases, portions of the access lines oriented in the first direction may overlie portions of plate lines, the access lines oriented in the first direction in the first array of memory cells may be coupled to first electrical connections below the access lines oriented in the first direction in the first array of memory cells, and the second plate lines oriented in the first direction may be coupled to second electrical connections above the second plate lines. In some cases, the device may include control circuit portion including a plate line decoder coupled with the first plate line through an on pitch via (OPV) and the plurality of second plate lines via the first plate line.

In some cases, the support circuitry may include a first digit line decoder coupled with the access line oriented in the first direction that may be coupled with the ferroelectric memory cell of the first array, a second digit line decoder coupled with the access line oriented in the first direction that may be coupled with the ferroelectric memory cell of the second array, and a word line decoder coupled with both the access line oriented in the second direction that may be coupled with the ferroelectric memory cell of the first array and the access line oriented in the second direction that may be coupled with the ferroelectric memory cell of the second array. In some cases, the first plate line may be coupled with each of the second plate lines through an on pitch via (OPV). In some cases, the OPVs may be located at locations where digit line decoders are discontinuous. In some cases, one or more of the OPVs may include a selector device between the first plate line and a second plate line of the plurality. In some cases, a plurality of additional access lines each coupled with a selector device of the one or more OPVs. In some cases, the device may include a third plate line oriented in the first direction and coupled with other ferroelectric memory cells in the two or more sections of the first array, and a plurality of fourth plate lines oriented in the first direction, each of the fourth plate lines coupled with the third plate line and other ferroelectric memory cells of the section of the second array.

In some cases, the first plate line and the plurality of second plate lines are associated with cells having even-numbered addresses, and the third plate line and the plurality of fourth plate lines are associated with cells having odd-numbered addresses. In some cases, the third plate line may be coupled with each of the fourth plate lines through an on pitch via (OPV). In some cases, the first array and the second array overlie the support circuitry.

In some cases, the memory device, which may be referred to as an electronic memory device, may include a first three-dimensional array of ferroelectric memory cells overlying a second three-dimensional array of ferroelectric memory cells, each memory cell having a ferroelectric container and a selector device, a first plate line coupled with ferroelectric memory cells of the first three-dimensional array and a second plate line coupled with ferroelectric memory cells of the second three-dimensional array, support circuitry underlying the first three-dimensional array and the second three-dimensional array, wherein the underlying support circuitry comprises at least one of a plurality of word line decoders coupled with word lines configured to separately access memory cells in the first three-dimensional array and the second three-dimensional array, a plurality of digit line decoders coupled with digit lines configured to separately access memory cells in the first three-dimensional array and the second three-dimensional array, or a plurality of plate line decoders, wherein at least one plate line decoder of the plurality may be coupled with the first plate line or the second plate line, and control circuit portion that may be adjacent to the support circuitry. In some cases, the first plate line may be a global plate line and the second plate line may be a local plate line.

In some cases, one or more of the ferroelectric containers of the first three-dimensional array are coupled with the first plate line, one or more of the ferroelectric containers of the second three-dimensional array are coupled with the second plate line, and the first plate line and the second plate line are coupled with each other. In some cases, the selector device of each cell includes a thin-film transistor (TFT), a gate terminal of each TFT may be coupled with one of the word lines, and a drain terminal of each TFT may be coupled with one of the digit lines. In some cases, the control circuit portion comprises the plurality of word line decoders. In some cases, the control circuit portion comprises the plurality of digit line decoders. In some cases, the control circuit portion comprises the plurality of plate line decoders.

FIG. 12 illustrates an exemplary cross-sectional diagram of two-deck ferroelectric memory cells 1200 of a memory device that supports multiple plate line architecture for multideck memory array in accordance with embodiments of the present disclosure. FIG. 12 may be an example of an alternative multideck memory architecture with the memory cell configuration inverted upside down in comparison to the memory cell configuration shown in FIGS. 9 through 11. Consequently, the plate lines are buried one level deeper from the global plate line, i.e., top-most plate line, point of view when compared to the architecture shown in FIGS. 9 through 11. Nonetheless, plate line decoders located in control circuit portion may still provide access to plate lines associated with the memory cells of both upper and lower decks by adding one more set of plate lines and OPVs. As an example, the global plate line 1210-*c* connects to the plate line 1210-*b* of the upper deck through OPVs 505-*b*1 and subsequently the plate lines 1210-*b* of the upper deck connect to the plate lines of the lower deck through another set of OPVs 505-*b*2. This configuration completes the "tops-down" accessing scheme for the plate line decoders in control circuit portion through multiple sets of plate lines and OPVs. As for the "bottoms-up" accessing scheme, digit line decoders 980 and 985 may provide access to the digit lines 915-b and 915-a through contacts 990 and 995. Other CuA components such as word line decoders may provide access to word lines 110 of both upper deck and lower deck (not shown). It should be appreciated that the vertically interleaved "T" and "inverted T" electrical paths formation is accomplished as depicted in FIG. 12. For example, contacts 990 connected to upper deck digit lines 915-b may be viewed as "T" configuration while OPVs 505-b1 connected to local plate lines 1210-b and OPVs 505-b2 connected to local plate lines 1210-a as "inverted T" configuration. In addition, digit lines 915 and local plate lines 1210 are interleaved so as to enable contacts and OPVs make appropriate connections.

In some cases, the memory device, which may be referred to as an electronic memory device, may include a first array of memory cells configured in a cross point architecture, the first array comprising a plurality of sections, each cell of the first array comprising a ferroelectric memory cell coupled with an access line oriented in a first direction and an access line oriented in a second direction that may be substantially orthogonal to the first direction, a second array of memory cells configured in the cross point architecture, the second array comprising a plurality of sections, wherein the first array overlies the second array, each cell of the second array comprising a ferroelectric memory cell coupled with an access line oriented in the first direction and an access line oriented in the second direction, a plurality of first plate lines oriented in the first direction and coupled with ferroelectric memory cells of a section of the first array, a plurality of second plate lines oriented in the first direction, each of the second plate lines coupled with a first plate line and to ferroelectric memory cells of a section of the second array, and a third plate line oriented in the first direction and spanning two or more sections of the first array or the second array, the third plate line coupled with plate lines of the first plurality.

In some cases, a first plate line of the plurality of first plate lines may be coupled with the third plate line through a first on pitch via (OPV). In some cases, the first plate line of the plurality of first plate lines may be coupled with a second plate line of the plurality of second plate lines through a second OPV. In some cases, the first OPV may be located in a portion of the first array including a discontinuity of the access line of the first array oriented in the first direction and the second OPV may be located in a portion of the second array including a discontinuity of the access line of the second array oriented in the first direction.

Figure 13:
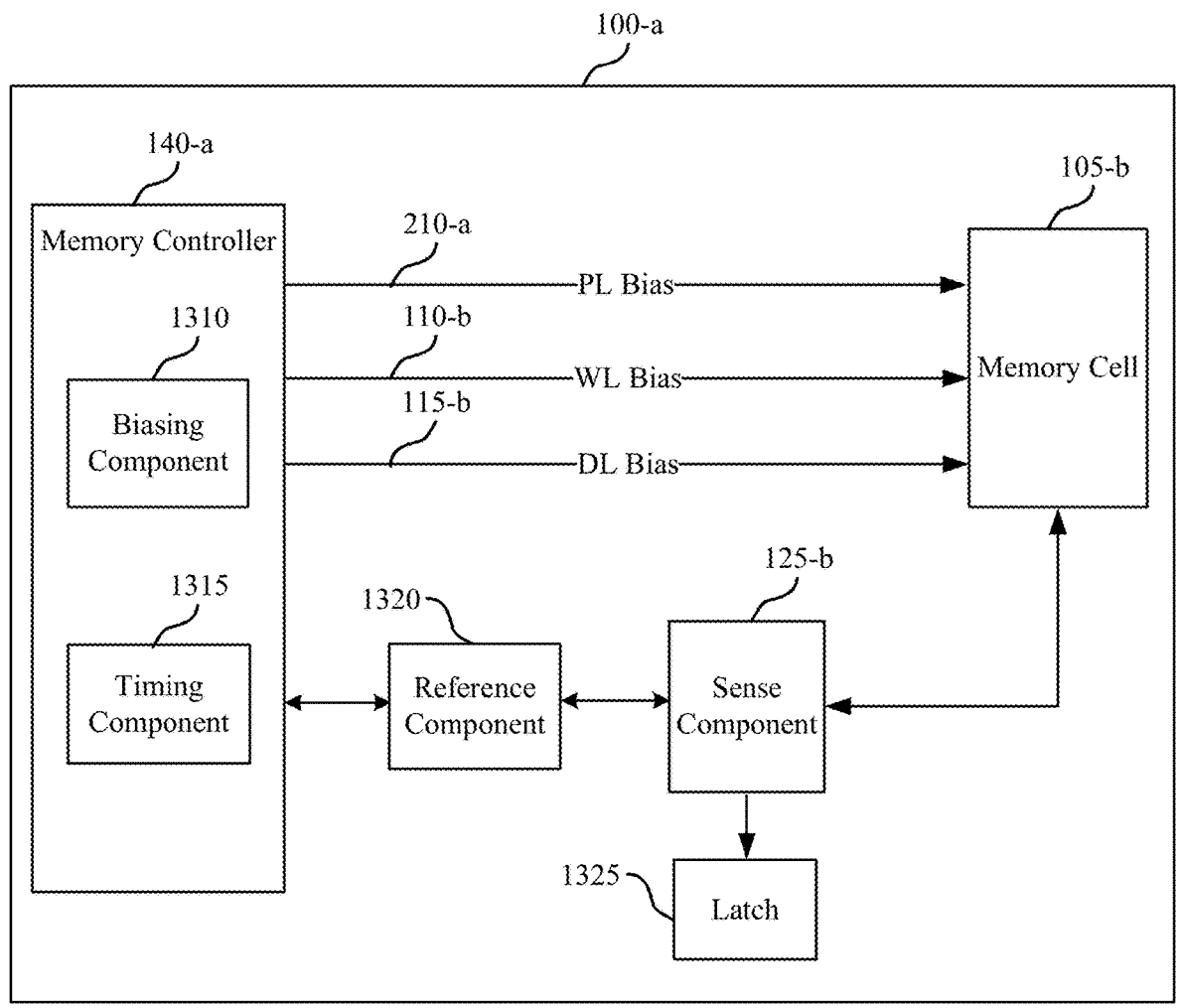
FIG. 13 shows a block diagram of a memory array of a memory device that supports multiple plate line architecture for multideck memory array in accordance with embodiments of the present disclosure.

FIG. 13 shows a block diagram 1300 of a memory array 100-a of a memory device that supports multiple plate line architecture for multideck memory array in accordance with embodiments of the present disclosure. Memory array 100-a may be referred to as an electronic memory apparatus and includes memory controller 140-a and memory cell 105-b, which may be examples of memory controller 140 and memory cell 105 described with reference to FIG. 1. Memory controller 140-a may include biasing component 1310 and timing component 1315 and may operate memory array 100-a as described with reference to FIG. 1. Memory controller 140-a may be in electronic communication with word line 110-b, digit line 115-b, plate line 210-a, and sense component 125-b, which may be examples of word line 110, digit line 115, plate line 210, and sense component 125 described with reference to FIGS. 1 and 2. Memory array 100-a may also include reference component 1320 and latch 1325. The components of memory array 100-a may be in electronic communication with each other and may perform the functions described with reference to FIGS. 1-3. In some cases, reference component 1320, sense component 125-b, and latch 1325 may be components of memory controller 140-a.

Memory controller 140-a may be configured to activate word line 110-b, plate line 210-a, or digit line 115-b by applying voltages to those various nodes. For example, biasing component 1310 may be configured to apply a voltage to operate memory cell 105-b to read or write memory cell 105-b as described above. In some cases, memory controller 140-a may include a row decoder, column decoder, or both, as described with reference to FIG. 1. This may enable memory controller 140-a to access one or more memory cells 105. Biasing component 1310 may also provide voltage potentials to reference component 1320 in order to generate a reference signal for sense component 125-b. Additionally, biasing component 1310 may provide voltage potentials for the operation of sense component 125-b.

In some cases, memory controller 140-a may perform its operations using timing component 1315. For example, timing component 1315 may control the timing of the various word line selections or plate line biasing, including timing for switching and voltage application to perform the memory functions, such as reading and writing, discussed herein. In some cases, timing component 1315 may control the operations of biasing component 1310.

Reference component 1320 may include various components to generate a reference signal for sense component 125-b. Reference component 1320 may include circuitry configured to produce reference signals. In some cases, reference component 1320 may include other ferroelectric memory cells 105. In some examples, reference component 1320 may be configured to output a voltage with a value between the two sense voltages, as described with reference to FIG. 3. Or reference component 1320 may be designed to output a virtual ground voltage (i.e., approximately 0V).

Sense component 125-b may compare a signal from memory cell 105-b (through digit line 115-b) with a reference signal from reference component 1320. Upon determining the logic state, the sense component may then store the output in latch 1325, where it may be used in accordance with the operations of an electronic device that memory array 100-a is a part.

In some cases, the memory device, which may be referred to as an electronic memory device, may include a first three-dimensional array of ferroelectric memory cells overlying a second three-dimensional array of ferroelectric memory cells, a first plate line coupled with ferroelectric memory cells of the first three-dimensional array, a second plate line coupled with the first plate line through an on pitch via (OPV) and coupled with ferroelectric memory cells of the second three-dimensional array, and a controller in electronic communication with the first plate line, where the controller may be operable to identify a first cell from the first three-dimensional array of ferroelectric memory cells, execute access operations on the first cell of the first three-dimensional array using the first plate line, identify a second cell from the second three-dimensional array of ferroelectric memory cells, and execute access operations on the second cell of the second three-dimensional array using the first plate line and the second plate line.

Figure 14:
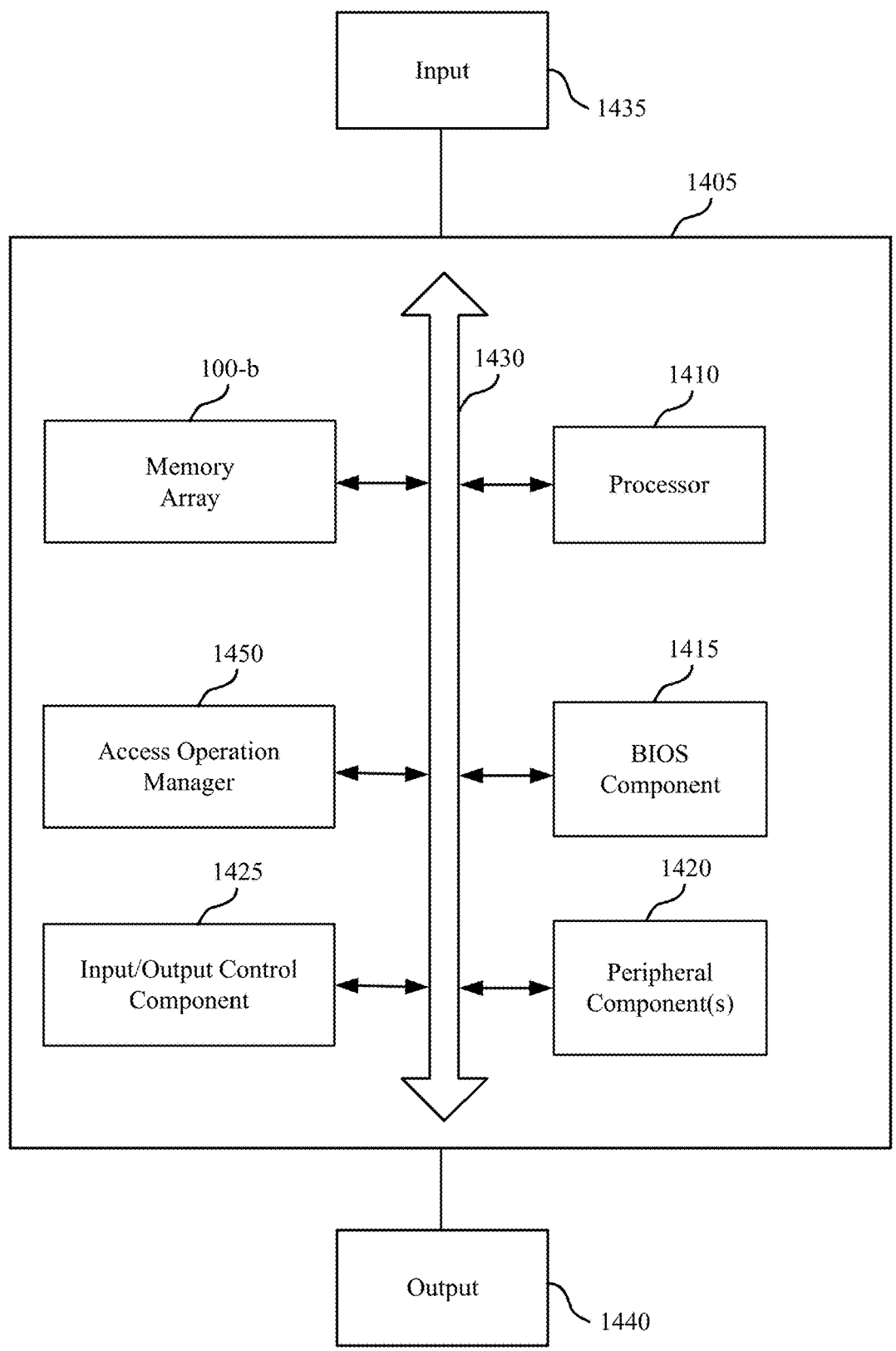
FIG. 14 shows a block diagram of a system including a memory array of a memory device that supports multiple plate line architecture for multideck memory array in accordance with embodiments of the present disclosure.

FIG. 14 shows a block diagram of a system 1400 including a memory array of a memory device that supports multiple plate line architecture for multideck memory array in accordance with embodiments of the present disclosure. System 1400 may include a device 1405, which may be an example of or include the components of memory controller 140 as described above, e.g., with reference to FIGS. 1 and 13. Device 1405 may include a memory array 100-b, which may be an example of memory array 100 described with reference to FIG. 1 and FIG. 13. Device 1405 may also include a processor 1410, BIOS component 1415, peripheral component(s) 1420, access operation manager 1450, and input/output control component 1425. The components of device 1405 may be in electronic communication with one another through bus 1430.

Processor 1410 may be configured to operate memory array 100-b. In some cases, processor 1410 may perform the functions of memory controller 140 described with reference to FIGS. 1 and 13. In other cases, memory controller 140 may be integrated into processor 1410. Processor 1410 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 1410 may perform various functions described herein, including operation of a memory array that supports multiple plate line architecture for multideck memory array. Processor 1410 may, for example, be configured to execute computer-readable instructions stored in memory array 100-b to cause device 1405 perform various functions or tasks.

BIOS component 1415 may be a software component that includes a basic input/output system (BIOS) operated as firmware, which may initialize and run various hardware components of system 1400. BIOS component 1415 may also manage data flow between processor 1410 and the various components, e.g., peripheral components 1420, input/output control component 1425, etc. BIOS component 1415 may include a program or software stored in read-only memory (ROM), flash memory, or any other non-volatile memory.

Peripheral component(s) 1420 may be any input or output device, or an interface for such devices, that is integrated into device 1405. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output control component 1425 may manage data communication between processor 1410 and peripheral component(s) 1420, input devices 1435, or output devices 1440. Input/output control component 1425 may also manage peripherals not integrated into device 1405. In some cases, input/output control component 1425 may represent a physical connection or port to the external peripheral.

Input 1435 may represent a device or signal external to device 1405 that provides input to device 1405 or its components. This may include a user interface or interface with or between other devices. In some cases, input 1435 may be a peripheral that interfaces with device 1405 via peripheral component(s) 1420 or may be managed by input/output control component 1425.

Output 1440 may represent a device or signal external to device 1405 configured to receive output from device 1405 or any of its components. Examples of output 1440 may include a display, audio speakers, a printing device, another processor or printed circuit board, etc. In some cases, output 1440 may be a peripheral that interfaces with device 1405 via peripheral component(s) 1420 or may be managed by input/output control component 1425.

The components of device 1405 may be made up of circuitry designed to carry out their functions. This may include various circuit elements, for example, conductive lines, transistors, capacitors, inductors, resistors, amplifiers, or other active or inactive elements, configured to carry out the functions described herein.

Figure 15:
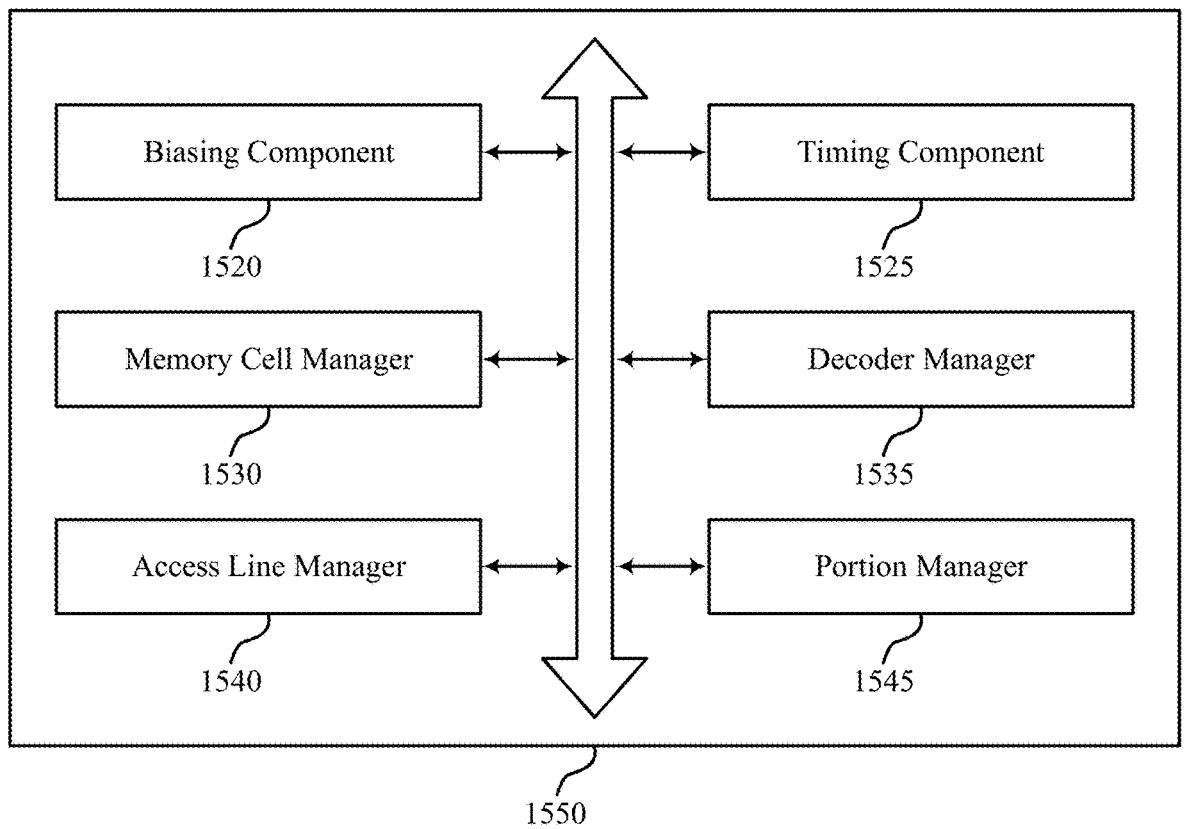
FIG. 15 shows a block diagram of an access operation manager of a memory device that supports multiple plate line architecture for multideck memory array in accordance with embodiments of the present disclosure.
Figure 16:
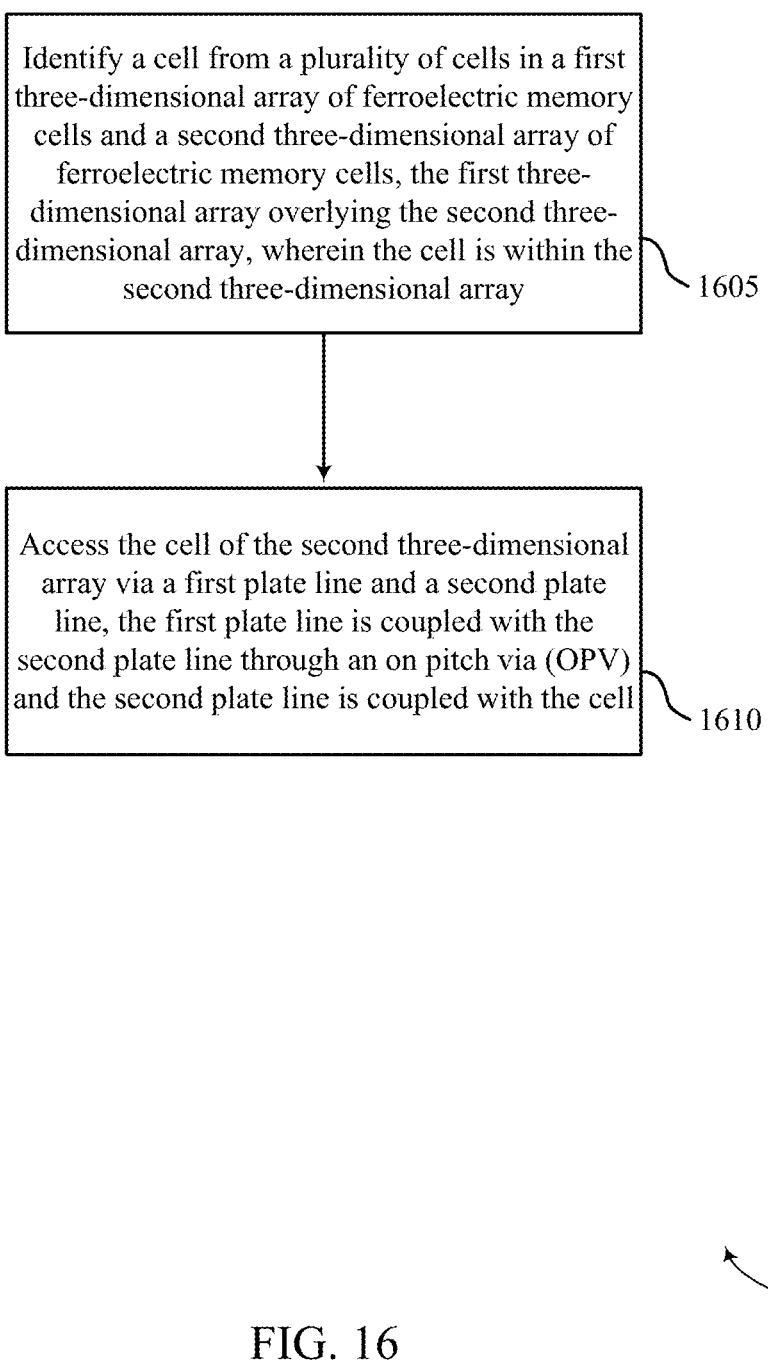
FIG. 16 shows a flowchart illustrating a method for multiple plate line architecture for multideck memory array in accordance with embodiments of the present disclosure.

FIG. 15 shows a block diagram 1500 of an access operation manager 1550 of a memory device that supports multiple plate line architecture for multideck memory array in accordance with embodiments of the present disclosure. The access operation manager 1550 may be an example of embodiments of an access operation manager 1450 described with reference to FIG. 14. The access operation manager 1550 may include biasing component 1520, timing component 1525, memory cell manager 1530, decoder manager 1535, access line manager 1540, and portion manager 1545. Each of these modules may communicate, directly or indirectly, with one another (e.g., via one or more buses).

Memory cell manager 1530 may identify a cell from a plurality of cells in a first three-dimensional array of ferroelectric memory cells and a second three-dimensional array of ferroelectric memory cells, the first three-dimensional array overlying the second three-dimensional array, wherein the cell may be within the second three-dimensional array.

Decoder manager 1535 may access the at least one cell using word line decoders, digit line decoders, and plate line decoders. In some cases, decoder manager 1535 may activate a digit line decoder coupled with the cell via a digit line configured to separately access memory cells in the first three-dimensional array and the second three-dimensional array. In some cases, memory cell manager 1530 may write to or read from the cell via the digit line and based at least in part on activating the digit line decoder.

Access line manager 1540 may be configured to manage access lines such as word lines, digit lines, or plate lines. In some cases, the access line manager may access the cell of the second three-dimensional array via a first plate line and a second plate line, the first plate line may be coupled with the second plate line through an on pitch via (OPV) and the second plate line may be coupled with the cell.

Portion manager 1545 may be configured to manage various parts of the memory device. In some cases, accessing the cell may be accomplished by using decoders placed in control circuit portion in collaboration with other decoders of support circuitry (e.g., CuA components) underneath memory array.

The various managers, components, and elements of FIGS. 13-15 may be means for performing functions recited herein. For example, as described herein, features of various methods described herein may be performed by components depicted in FIGS. 13-15.

FIG. 156 shows a flowchart illustrating a method 1600 for multiple plate line architecture for multideck memory array in accordance with embodiments of the present disclosure. The operations of method 1600 may be implemented by a memory controller 140 or its components as described herein. For example, the operations of method 1600 may be performed by an access operation manager as described with reference to FIGS. 14 and 15. In some examples, a memory controller 140 may execute a set of codes to control the functional elements of the device to perform the functions described below. Additionally or alternatively, the memory controller 140 may perform some or all of the functions described below using special-purpose hardware.

At block 1605 the memory controller 140 may identify a cell from a plurality of cells in a first three-dimensional array of ferroelectric memory cells and a second three-dimensional array of ferroelectric memory cells, the first three-dimensional array overlying the second three-dimensional array, wherein the cell may be within the second three-dimensional array. The operations of block 1605 may be performed according to the methods described with reference to FIGS. 1 through 15. In certain examples, some of the operations of block 1605 may be performed by the memory cell manager as described with reference to FIGS. 14 and 15.

At block 1610 the memory controller 140 may access the cell of the second three-dimensional array via a first plate line and a second plate line, the first plate line may be coupled with the second plate line through an on pitch via (OPV) and the second plate line may be coupled with the cell. The operations of block 1610 may be performed according to the methods described with reference to FIGS. 1 through 15. In certain examples, some of the operations of block 1610 may be performed by the access line manager as described with reference to FIGS. 14 and 15.

In some cases, the cell comprises a ferroelectric container and a selector device, and wherein accessing the cell comprises: activating a word line decoder coupled with the cell via a word line configured to concurrently access memory cells in the first three-dimensional array and the second three-dimensional array.

In some cases, the accessing may be based at least in part on an address of the cell, and wherein the first plate line and the second plate line are associated with the address of the cell.

It should be noted that the methods described above describe possible implementations, and that the operations and the steps may be rearranged or otherwise modified and that other implementations are possible. Furthermore, features from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "layer" used herein refers to a stratum or sheet of a geometrical structure. Each layer may have three dimensions (e.g., height, width, and depth) and may cover some or all of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 100.

The term "photolithography," as used herein, may refer to the process of patterning using photoresist materials and exposing such materials using electromagnetic radiation. For example, a photoresist material may be formed on a base material by, for example, spin-coating the photoresist on the base material. A pattern may be created in the photoresist by exposing the photoresist to radiation. The pattern may be defined by, for example, a photo mask that spatially delineates where the radiation exposes the photoresist. Exposed photoresist areas may then be removed, for example, by chemical treatment, leaving behind the desired pattern. In some cases, the exposed regions may remain and the unexposed regions may be removed.

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
identifying a memory cell from a plurality of memory cells in a first array of memory cells and a second array of memory cells, the first array overlying the second array, wherein the memory cell is within the second array;
accessing the memory cell of the second array via a first plate line and a second plate line, wherein the first plate line is coupled with the second plate line through an on pitch via (OPV) and the second plate line is coupled with the memory cell; and
accessing a second memory cell of the first array via the first plate line, wherein the first plate line is coupled with the second memory cell.

2. The method of claim 1, further comprising:
activating the first plate line using a plate line decoder coupled with the first plate line, wherein accessing the memory cell of the second array is based at least in part on activating the first plate line.

3. The method of claim 2, wherein the first plate line is coupled with the plate line decoder through a second OPV.

4. The method of claim 2, wherein the plate line decoder is located in a control circuit portion that is adjacent to the first array of memory cells.

5. The method of claim 2, wherein the plate line decoder is dedicated to a set of even-numbered plate line addresses comprising a first even-numbered plate line address associated with the memory cell and a second even-numbered plate line address associated with the second memory cell.

6. The method of claim 1, further comprising:
accessing a third memory cell of the second array via the first plate line and a third plate line different than the second plate line, wherein the first plate line is coupled with the third plate line through a third OPV and the third plate line is coupled with the third memory cell.

7. The method of claim 1, wherein the memory cell comprises a ferroelectric container and a selector device, and wherein accessing the memory cell comprises:
activating a word line decoder coupled with the memory cell via a word line configured to concurrently access memory cells in the first array and the second array.

8. The method of claim 1, further comprising:
activating a digit line decoder coupled with the memory cell via a digit line configured to separately access memory cells in the first array and the second array; and
writing to or reading from the memory cell via the digit line and based at least in part on activating the digit line decoder.

9. The method of claim 1, wherein the accessing is based at least in part on an address of the memory cell, and wherein the first plate line and the second plate line are associated with the address of the memory cell.

10. The method of claim 1, wherein the first array is a first three-dimensional array of ferroelectric memory cells and the second array is a second three-dimensional array of ferroelectric memory cells.

11. A memory device, comprising:
a first array of memory cells;
a second array of memory cells, the first array overlying the second array; and
a controller coupled with the first array and the second array, and operable to cause the memory device to:
identify a memory cell of the second array;
access the memory cell of the second array via a first plate line and a second plate line, wherein the first plate line is coupled with the second plate line through an on pitch via (OPV) and the second plate line is coupled with the memory cell; and
access a second memory cell of the first array via the first plate line, wherein the first plate line is coupled with the second memory cell.

12. The memory device of claim 11, wherein the controller is operable to cause the memory device to:
activate the first plate line using a plate line decoder coupled with the first plate line, wherein accessing the memory cell of the second array is based at least in part on activating the first plate line.

13. The memory device of claim 12, wherein the first plate line is coupled with the plate line decoder through a second OPV.

14. The memory device of claim 12, wherein the plate line decoder is located in a control circuit portion adjacent to the first array.

15. The memory device of claim 12, wherein the plate line decoder is associated with even-numbered plate line addresses and excludes odd-numbered plate line addresses, the even-numbered plate line addresses comprising an even-numbered first plate line address associated with the memory cell and an even-numbered second plate line address associated with the second memory cell.

16. The memory device of claim 11, wherein the controller is operable to cause the memory device to:
access a third memory cell of the second array via the first plate line and a third plate line, wherein the first plate line is coupled with the third plate line through a third OPV and the third plate line is coupled with the third memory cell.

17. The memory device of claim 11, wherein the memory cell comprises a ferroelectric container and a selector device, and wherein accessing the memory cell comprises:
activating a word line decoder coupled with the memory cell via a word line configured to concurrently access memory cells in the first array and the second array.

18. A method, comprising:
identifying a memory cell of a second deck of a first memory tile of a plurality of memory tiles; and
accessing the memory cell via a global plate line in a first deck that is above the second deck and via a local plate line in the second deck, wherein the global plate line extends across two or more memory tiles of the plurality of memory tiles, and wherein the local plate line is associated with the first memory tile and is coupled with the global plate line through an on pitch via (OPV).

* * * * *